United States Patent
Li et al.

(10) Patent No.: US 12,154,953 B2
(45) Date of Patent: Nov. 26, 2024

(54) METHOD FOR MANUFACTURING CONTACT HOLE, SEMICONDUCTOR STRUCTURE AND ELECTRONIC EQUIPMENT

(71) Applicant: CHANGXIN MEMORY TECHNOLOGIES, INC., Hefei (CN)

(72) Inventors: Ran Li, Hefei (CN); Ching-Lun Ma, Hefei (CN); Leilei Duan, Hefei (CN); Xinru Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 521 days.

(21) Appl. No.: 17/574,652

(22) Filed: Jan. 13, 2022

(65) Prior Publication Data
US 2023/0043575 A1   Feb. 9, 2023

Related U.S. Application Data

(63) Continuation of application No. PCT/CN2021/112142, filed on Aug. 11, 2021.

(30) Foreign Application Priority Data

Aug. 9, 2021   (CN) .......................... 202110906602.3

(51) Int. Cl.
*H01L 29/40* (2006.01)
*H01L 21/311* (2006.01)
*H01L 29/423* (2006.01)
*H10B 12/00* (2023.01)

(52) U.S. Cl.
CPC ...... *H01L 29/401* (2013.01); *H01L 21/31116* (2013.01); *H01L 21/31144* (2013.01); *H01L 29/4236* (2013.01); *H10B 12/05* (2023.02); *H10B 12/09* (2023.02); *H10B 12/315* (2023.02); *H10B 12/482* (2023.02); *H10B 12/485* (2023.02); *H10B 12/488* (2023.02); *H10B 12/50* (2023.02); *H10B 12/0335* (2023.02)

(58) Field of Classification Search
CPC ............. H01L 29/401; H01L 21/31116; H01L 21/31144; H01L 29/4236; H01L 21/76831; H01L 21/76832; H10B 12/05; H10B 12/09; H10B 12/315; H10B 12/482; H10B 12/485; H10B 12/488; H10B 12/50; H10B 12/0335
See application file for complete search history.

*Primary Examiner* — Benjamin P Sandvik
*Assistant Examiner* — John Patrick Cornely
(74) *Attorney, Agent, or Firm* — Kilpatrick Townsend & Stockton LLP

(57) ABSTRACT

Disclosed is a method for manufacturing a contact hole, a semiconductor structure and electronic equipment. The method includes: forming a mask layer on an upper end face of a first oxide layer of the semiconductor structure, and exposing a pattern of a target contact hole on the mask layer; exposing a portion, corresponding to a target contact hole, of an upper end face of a contact layer and a portion, corresponding to the target contact hole, of an upper end face of an upper layer structure; depositing a second insulation layer on an etched surface, and depositing a second oxide layer on the second insulation layer; and removing portions, above the upper end face of the first oxide layer, of the second insulation layer and the second oxide layer, and removing a part of the contact layer, and exposing an upper end face of a zeroth layer contact.

20 Claims, 29 Drawing Sheets

METHOD FOR MANUFACTURING CONTACT HOLE, SEMICONDUCTOR STRUCTURE AND ELECTRONIC EQUIPMENT

CROSS-REFERENCE TO RELATED APPLICATIONS

This application is a continuation of International Patent Application No. PCT/CN2021/112142 filed on Aug. 11, 2021, which claims priority of Chinese Patent Application No. 202110906602.3 filed on Aug. 9, 2021. The aforementioned patent applications are incorporated by reference in their entirety.

TECHNICAL FIELD

The disclosure relates to the field of semiconductor production, in particular to a method for manufacturing a contact hole, a semiconductor structure and electronic equipment.

BACKGROUND

After a 20-nm process for manufacturing a DRAM (Dynamic Random Access Memory) came into use, the integration level of manufacturing a semiconductor is increased, and it is harder and harder to shrink a device. In the wake of continuous development of a semiconductor integrated circuit device technology, the line width becomes smaller and smaller, the height of a storage capacitor in the DRAM becomes larger and larger, which makes requests for deep contact holes. However, a window for manufacturing a contact hole with a high depth-width ratio is relatively narrow, an overlarge contact hole will be likely to cause a short circuit, and an over-small contact hole will be prone to cause insufficient etching.

SUMMARY

In a first aspect, the embodiment of the disclosure provides a method for manufacturing a contact hole, which is applied to a semiconductor structure including an array area and a peripheral area. A substrate of the array area includes an embedded word line and a first insulation layer, the first insulation layer is provided, in a direction away from the embedded word line, with a storage capacitor array and a contact layer, and the contact layer covers the storage capacitor array. A substrate of the peripheral area is provided with at least one active area, an isolation layer and a gate structure are provided in a direction away from the at least one active area, and the isolation layer covers the gate structure. The isolation layer includes a lower layer structure, a middle layer structure and an upper layer structure. Two sides of the gate structure include zeroth layer contacts, and a top of each of the zeroth layer contacts is lower than an upper end face of the upper layer structure. A first oxide layer is arranged in a direction away from the contact layer and the upper layer structure. The method includes:

a mask layer is formed on the upper end face of the first oxide layer, and a pattern of a target contact hole is exposed on the mask layer;

the first oxide layer is etched according to the pattern of the target contact hole, so as to expose a portion, corresponding to the target contact hole, of an upper end face of the contact layer and a portion, corresponding to the target contact hole, of the upper end face of the upper layer structure;

a second insulation layer is deposited on an etched surface, and a second oxide layer is deposited on the second insulation layer; and portions, above the upper end face of the first oxide layer, of the second insulation layer and the second oxide layer, are removed, and the upper end face of the contact layer which is exposed is etched downwards so as to remove a part of the contact layer, and the upper end face of the upper layer structure which is exposed is etched downwards so as to expose an upper end face of the zeroth layer contact.

In a second aspect, the embodiment of the disclosure provides a method for manufacturing a contact hole, which is applied to a semiconductor structure. A bit line, a word line, active areas and an isolation structure located between the active areas which are adjacent are manufactured on a substrate of the semiconductor structure. An isolation layer and a gate structure are arranged in a direction away from the active areas, and the isolation layer covers the gate structure. The isolation layer includes a lower layer structure, a middle layer structure and an upper layer structure.

The method includes: with regard to the contact hole to be manufactured, a mask layer is formed on a corresponding target upper end face, and a pattern of a target contact hole is exposed on the mask layer, where the target contact hole is any one of a target bit line contact hole, a target word line contact hole, a target active area contact hole and a target gate contact hole, the target bit line contact hole represent a contact hole used for being connected to the bit line, the target word line contact hole represent a contact hole used for being connected to the word line, the target active area contact hole represent a contact hole used for being connected to the active areas, and the target gate contact hole represent a contact hole used for being connected to a gate of the gate structure;

a target contact surface corresponding to a target contact hole is exposed by etching according to the pattern of the target contact hole, where the target contact surface is any one of an upper end face of a target bit line, an upper end face of a target word line, an upper end face of a target active area line and an upper end face of a target gate line;

a first insulation layer is deposited on an etched surface, and a first oxide layer is deposited on the first insulation layer; and portions, above every horizontal upper end face, of the first insulation layer and the first oxide layer are removed, so as to expose the target contact surface.

In a third aspect, the embodiment of the disclosure provides a semiconductor structure manufactured according to the method for manufacturing a contact hole provided by the embodiment of the disclosure.

In a fourth aspect, the embodiment of the disclosure provides electronic equipment including the semiconductor structure provided by the embodiment of the disclosure.

Other features and advantages of the disclosure will be illustrated in the subsequent description, and partially are obvious in the description, or may be known by implementing the disclosure. The objects and the other advantages of the disclosure may be realized and attained by the structure particularly pointed out in the written description, claims, and accompanying drawings.

BRIEF DESCRIPTION OF DRAWINGS

The accompanying drawings described herein serve to provide a further understanding of the disclosure and form a part hereof, and the illustrative embodiments of the disclosure and the description of the illustrative embodiments serve to explain the disclosure and are not to be construed as unduly limiting the disclosure. In the accompanying drawings.

DETAILED DESCRIPTION

After a 20-nm process for manufacturing a DRAM (Dynamic Random Access Memory) came into use, the integration level of manufacturing a semiconductor is increased, and it is harder and harder to shrink a device. In the wake of continuous development of a semiconductor integrated circuit device technology, the line width becomes smaller and smaller, the height of a storage capacitor in the DRAM becomes larger and larger, which makes requests for deep contact holes. However, a window for manufacturing a contact hole with high depth-width ratio is relatively narrow, an overlarge contact hole will be likely to cause a short circuit, and an over-small contact hole will be prone to cause insufficient etching. On this basis, the embodiment of the disclosure provides a method for manufacturing a contact hole, a semiconductor structure and electronic equipment.

Preferred embodiments of the disclosure will be described below with reference to the accompanying drawings of the description. It should be understood that the preferred embodiments described herein are only used for describing and explaining the disclosure but are not intended to limit the disclosure, and the embodiments of the disclosure and features in the embodiments may be combined with each other without conflict.

Figure 1:
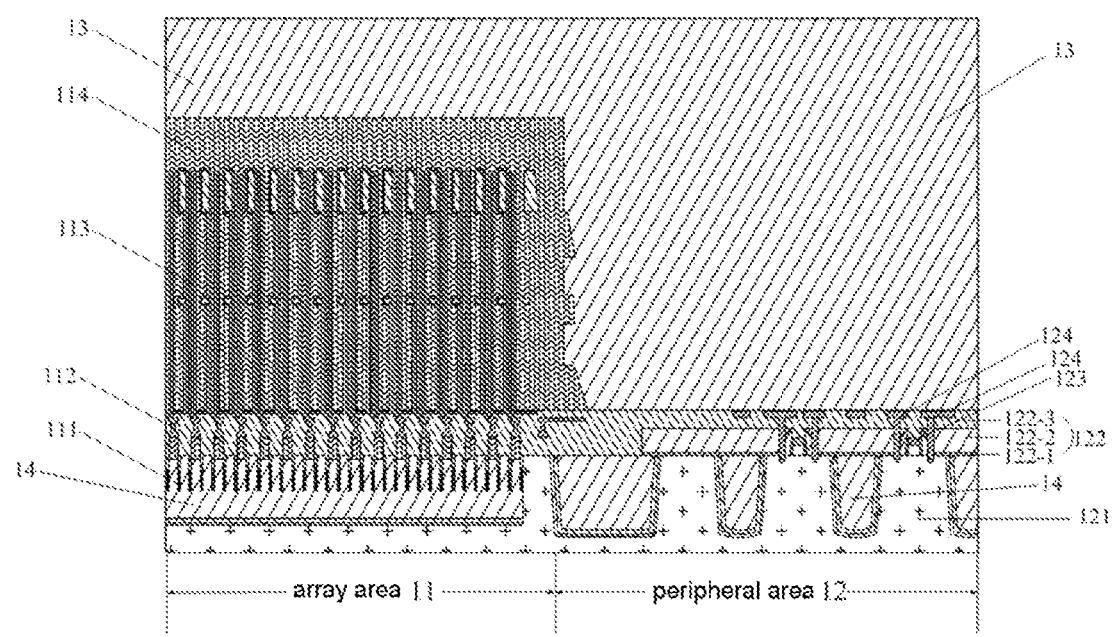
FIG. 1 is a sectional view of an initial structure of a semiconductor structure in the embodiment of the disclosure.

One embodiment of the disclosure provides a method for manufacturing a contact hole, which is applied to a semiconductor structure being a dynamic random access memory. In the embodiment of the disclosure, before the contact hole is manufactured, a sectional view of an initial structure of the semiconductor structure is shown in FIG. 1. The semiconductor structure includes an array area 11 and a peripheral area 12, where a substrate of the array area 11 includes an embedded word line 111 and a first insulation layer 112, the first insulation layer 112 is provided, in a direction away from the embedded word line 111, with a storage capacitor array 113 and a contact layer 114, and the contact layer 114 covers the storage capacitor array 113. A substrate of the peripheral area 12 is provided with at least one active area 121, an isolation layer 122 and a gate structure 123 are provided in a direction away from the at least one active area 121, and the isolation layer 122 covers the gate structure 123. The isolation layer 122 includes a lower layer structure 122-1, a middle layer structure 122-2 and an upper layer structure 122-3. Two sides of the gate structure 123 include zeroth layer contacts 124, and a top of each of the zeroth layer contacts 124 is lower than an upper end face of the upper layer structure 122-3. A first oxide layer 13 is arranged in a direction away from the contact layer 114 and the upper layer structure 122-3. The isolation structures 14 located between the at least one active area (AA) 121 which are adjacent are arranged on the substrate of the array area 11 and the substrate of the peripheral area 12 and used for isolating a plurality of the at least one active area 121 on the substrate of the semiconductor structure, where an upper end face of the first insulation layer 112 in the array area 11 is flush with the upper end face of the upper layer structure 122-3 of the isolation layer 122 in the peripheral area 12. The substrate of the array area 11 and the substrate of the peripheral area 12 may be made of silicon (Si). The first insulation layer 112, and the upper layer structure 122-3 and the lower layer structure 122-1 of the isolation layer 122 are made of the same insulation material, which may be silicon nitride (SiN). The middle layer structure 122-2 of the isolation layer 122 is made of an oxide, which may be silicon dioxide (SiO2). The first oxide layer 13 and the middle layer structure of the isolation layer 122 is made of a same material, which may also be silicon dioxide. The contact layer 114 may be made of polysilicon (Poly). The zeroth layer contact 124 is a metal pad, which may be made of tungsten (W).

Figure 2:
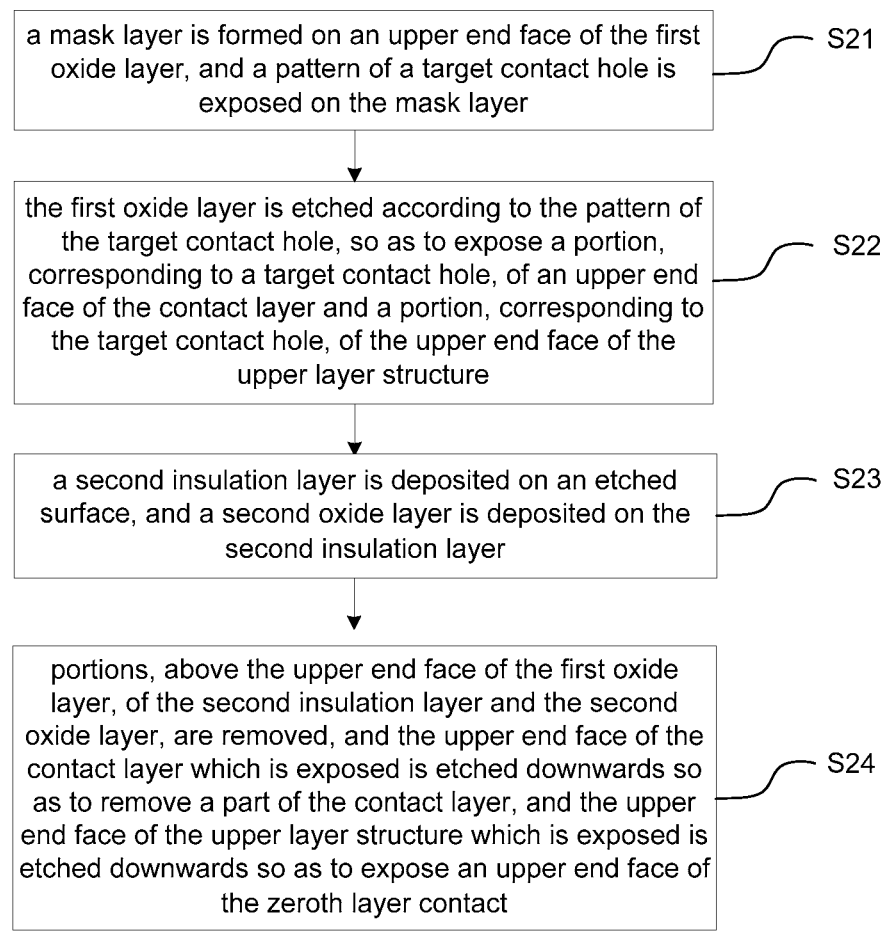
FIG. 2 is a schematic diagram of an implementation flow of a method for manufacturing a contact hole provided in the embodiment of the disclosure.

FIG. 2 is a schematic diagram of an implementation flow of the method for manufacturing a contact hole provided in the embodiment of the disclosure. The method for manufacturing a contact hole may includes:

S21, a mask layer is formed on an upper end face of the first oxide layer, and a pattern of a target contact hole is exposed on the mask layer.

Figure 3:
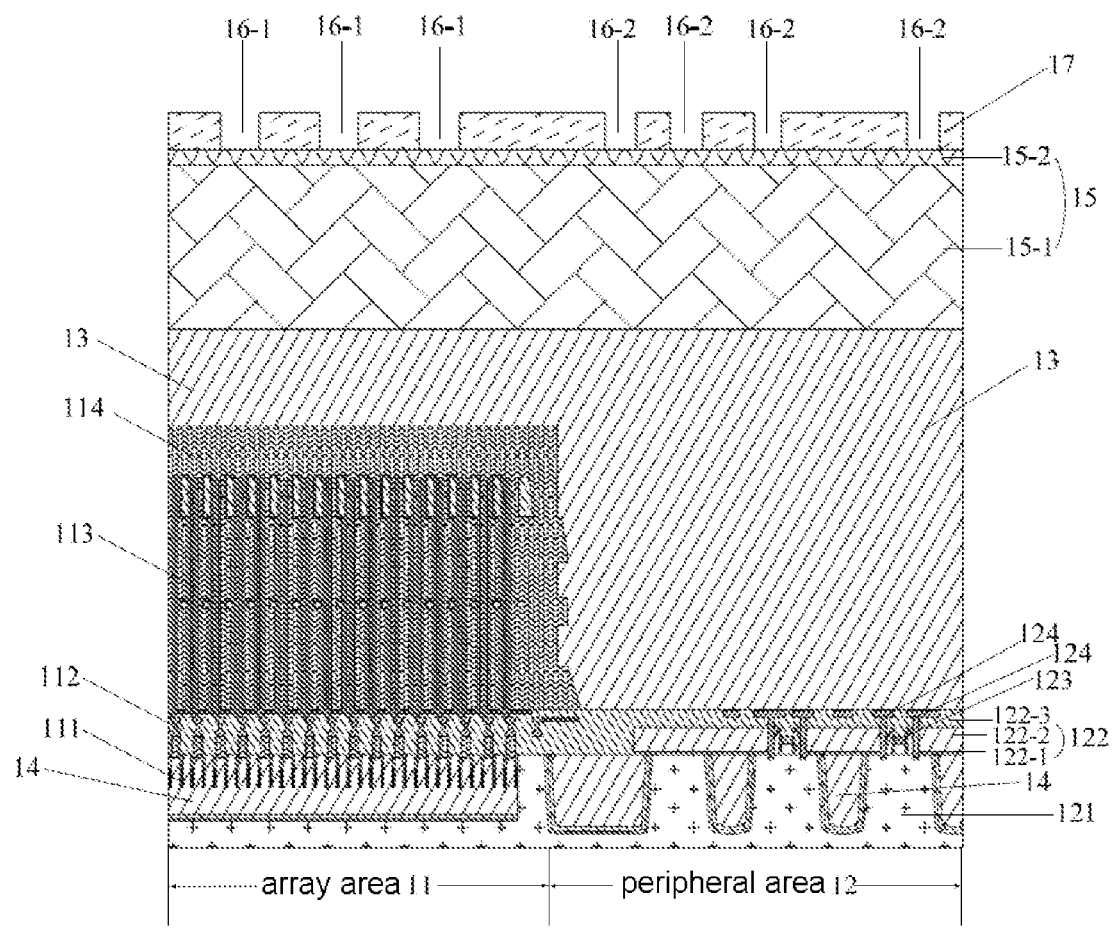
FIGS. 3-6 are sectional views of the semiconductor structure corresponding to each step of the method for manufacturing a contact hole provided in the embodiment of the disclosure.

In specific implementation, as shown in FIG. 3, the mask layer 15 is formed on the upper end face of the first oxide layer 13, and the patterns of the target contact holes 16-1 and 16-2 are exposed on the mask layer 15. The mask layer 15 may include a first mask layer 15-1 and a second mask layer 15-2. The pattern of the target contact hole 16-1 is a pattern corresponding to the contact hole to be manufactured in the array area 11, and the pattern of the target contact hole 16-2 is a pattern corresponding to the contact hole to be manufactured in the peripheral area 12.

In specific implementation, the first mask layer 15-1 is deposited on the upper end face of the first oxide layer 13, the second mask layer 15-2 is deposited on an upper end face of the first mask layer 15-1, and the patterns of the target contact holes 16-1 and 16-2 are exposed on the second mask layer 15-2 by means of photoresist 17. When the patterns of the target contact holes 16-1 and 16-2 are exposed, dimensions (that is, diameters) of the patterns of the target contact holes 16-1 and 16-2 may be set to be slightly larger than an existing process dimension, such that a dimension (that is, a diameter of the contact hole) of an opening of the corresponding target contact hole is larger than an existing process dimension. The dimension may be autonomously set according to actual situations and is not limited by the embodiment of the disclosure such that difficulty of a process may be reduced. The first mask layer 15-1 may be made of carbon, and the second mask layer 15-2 may be made of silicon oxynitride (SiON).

S22, the first oxide layer is etched according to the pattern of the target contact hole, so as to expose a portion, corresponding to a target contact hole, of an upper end face of the contact layer and a portion, corresponding to the target contact hole, of the upper end face of the upper layer structure.

Figure 4:
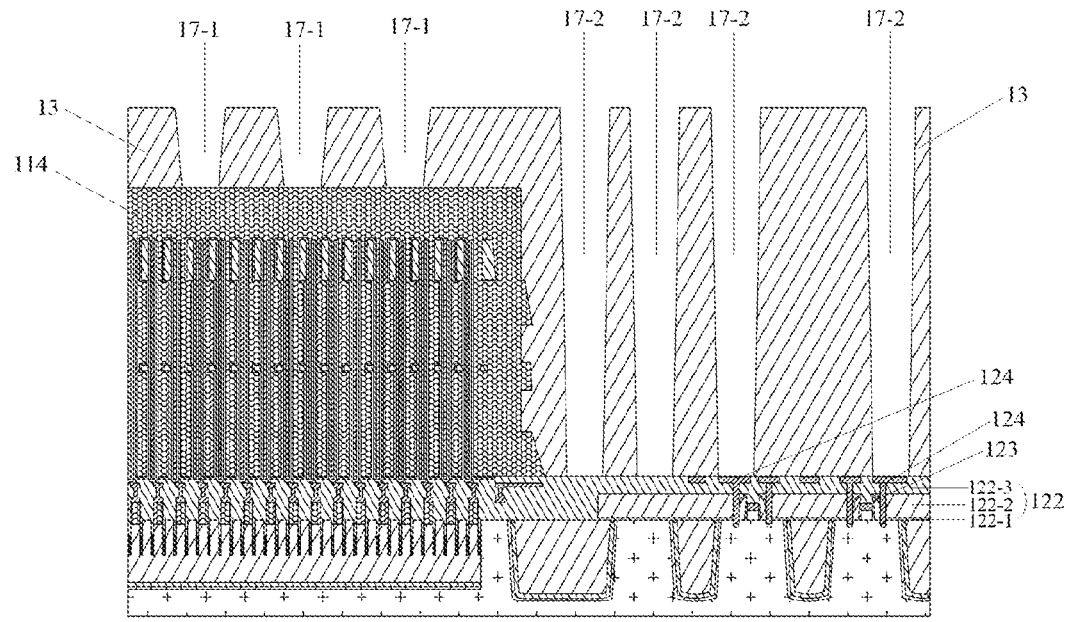

In specific implementation, as shown in FIG. 4, the first oxide layer 13 is etched according to the patterns of the target contact holes 16-1 and 16-2 to form the target contact hole 17-1 in the array area 11 and the target contact hole 17-2 in the peripheral area 12, so as to expose the portion, corresponding to the target contact hole 17-1, of an upper end face of the contact layer 114 and the portion, corresponding to the target contact hole 17-2, of the upper end face of the upper layer structure 122-3 of the isolation layer 122.

S23, a second insulation layer is deposited on an etched surface, and a second oxide layer is deposited on the second insulation layer.

Figure 5:
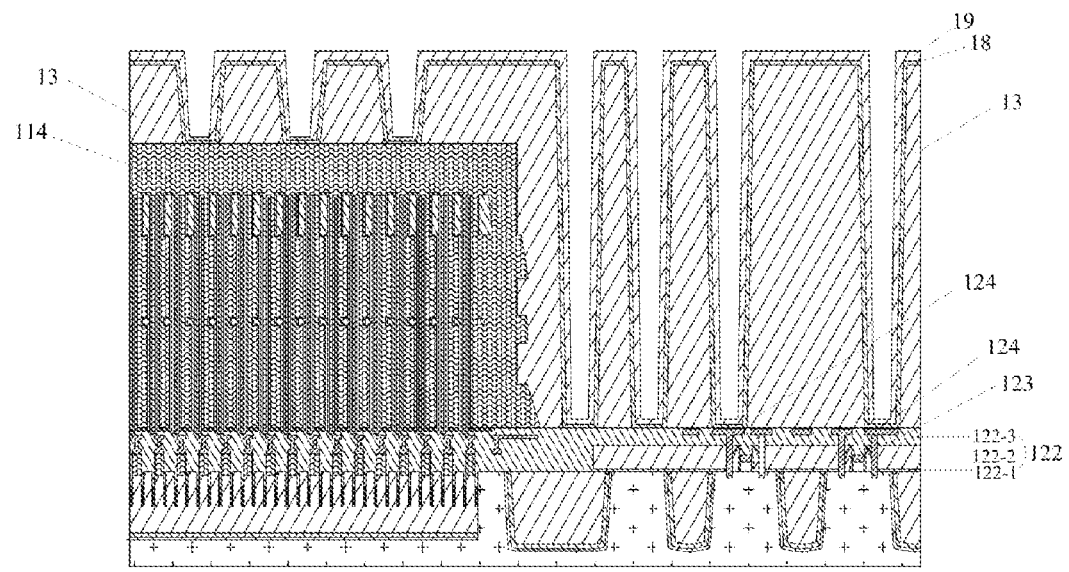

In specific implementation, as shown in FIG. 5, the second insulation layer 18 is deposited on the etched surface, and the second oxide layer 19 is deposited on a surface of the second insulation layer 18, so as to shrink the target contact hole 17-1 in the array area 11 and the target contact hole 17-2 in the peripheral area 12 such that direct parasitic capacitance of the target contact hole may be reduced.

Specifically, the second insulation layers 18 are deposited on an upper end face and each side face of the etched first oxide layer 13, the upper end face of the contact layer 114 which is exposed, and the upper end face of the upper layer structure 122-3 of the isolation layer 122 which is exposed, and the second oxide layer 19 is deposited on the second insulation layer 18.

In specific implementation, the second insulation layer 18, the first insulation layer 112, and the upper layer structure 122-3 and the lower layer structure 122-1 of the isolation layer 122 are made of a same material, which may be silicon nitride. The second oxide layer 19 and the first oxide layer 13 are made of a same material, which may be silicon dioxide. The material is not limited by the embodiment of the disclosure.

S24, portions, above the upper end face of the first oxide layer, of the second insulation layer and the second oxide layer, are removed, and the upper end face of the contact layer which is exposed is etched downwards so as to remove a part of the contact layer, and the upper end face of the upper layer structure which is exposed is etched downwards so as to expose an upper end face of the zeroth layer contact.

Figure 6:
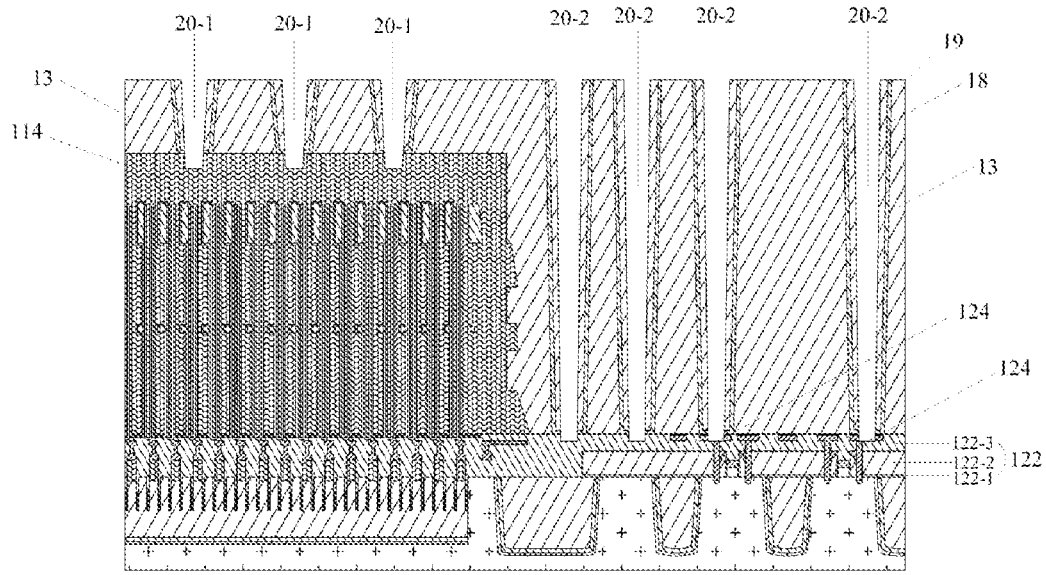

In specific implementation, as shown in FIG. 6, the portions, above the upper end face of the first oxide layer 13, of the second insulation layer 18 and the second oxide layer 19 may be removed by dry etching, the upper end face of the contact layer 114 which is exposed in the array area 11 is etched downwards so as to remove the part of the contact layer 114, and the upper end face of the upper layer structure 122-3 of the isolation layer 122 which is exposed in the peripheral area 12 is etched downwards so as to expose the upper end face of the zeroth layer contact 124. Therefore, the contact hole 20-1 in the array area 11 and the contact hole 20-2 in the peripheral area 12 are formed and in communication with the contact layer 114 and the zeroth layer contact 124 respectively.

The semiconductor structure further includes a bit line (which is not shown in FIGS. 2-6).

According to the method for manufacturing a contact hole provided by the embodiment of the disclosure, the dimension of the target contact hole is enlarged at first, and then the dimension of the target contact hole is reduced by depositing the insulation layer (that is, the second insulation layer 18) and the oxide layer (that is, the second oxide layer 19). Therefore, a risk of insufficient etching caused by an over-small contact hole is avoided, a problem of a short circuit of the zeroth layer contact 124 caused by an overlarge contact hole is avoided, and difficulty of manufacturing a semiconductor is reduced.

However, in practical application, as a critical dimension of the peripheral area becomes smaller and smaller, a bombardment needs to be strengthened in the process, and silicon in the at least one active area is severely damaged, which is harmful to a manufacturing process with a height difference and a high selection ratio.

On this basis, the embodiment of the disclosure provides another method for manufacturing a contact hole, which is applied to a semiconductor structure being a dynamic random access memory. A bit line 31, a word line 32, active areas 33 and an isolation structure 33-1 located between the active areas 33 which are adjacent are manufactured on a substrate of the semiconductor structure, an isolation layer 34 and a gate structure 35 are arranged in a direction away from the active areas 33, and the isolation layer 34 covers the gate structure 35. The isolation layer 34 includes a lower layer structure 34-1, a middle layer structure 34-2 and an upper layer structure 34-3. The substrate may be made of silicon. The upper layer structure 34-3 and the lower layer structure 34-1 of the isolation layer 34 are made of the same insulation material, which may be silicon nitride. The middle layer structure 34-2 of the isolation layer 34 is made of an oxide, which may be silicon dioxide.

Figure 7:
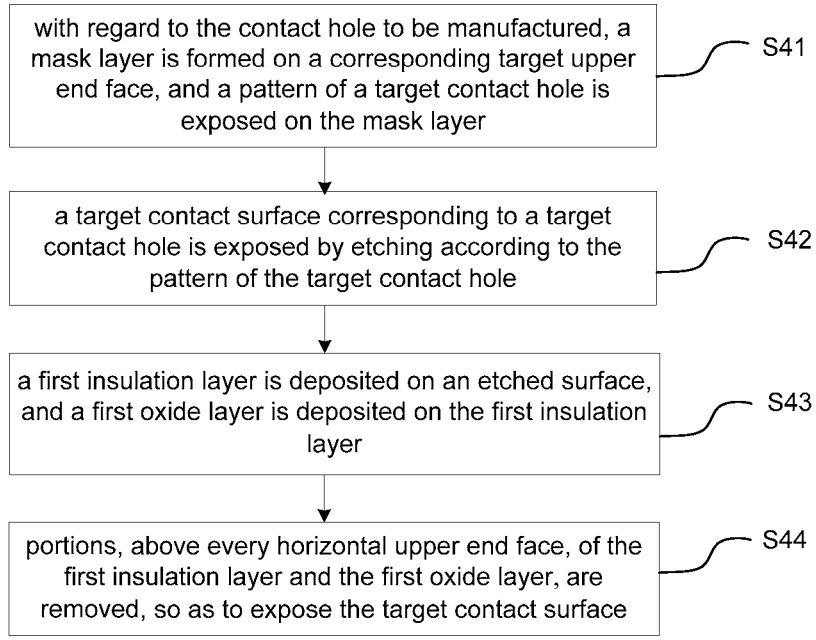
FIG. 7 is a schematic diagram of an implementation flow of another method for manufacturing a contact hole provided in the embodiment of the disclosure.

A schematic diagram of an implementation flow of the method for manufacturing a contact hole is shown in FIG. 7, and may includes:

S41, with regard to the contact hole to be manufactured, a mask layer is formed on a corresponding target upper end face, and a pattern of a target contact hole is exposed on the mask layer.

In specific implementation, the target contact hole is any one of a target bit line contact hole, a target word line contact hole, a target active area contact hole and a target gate contact hole, the target bit line contact hole represent a contact hole used for being connected to the bit line, the target word line contact hole represent a contact hole used for being connected to the word line, the target active area contact hole represent a contact hole used for being connected to the active areas, and the target gate contact hole represent a contact hole used for being connected to a gate of the gate structure.

S42, a target contact surface corresponding to a target contact hole is exposed by etching according to the pattern of the target contact hole.

The target contact surface is any one of an upper end face of a target bit line, an upper end face of a target word line, an upper end face of a target active area line and an upper end face of a target gate line.

S43, a first insulation layer is deposited on an etched surface, and a first oxide layer is deposited on the first insulation layer.

In specific implementation, the first insulation layer 112, and the upper layer structure 34-3 and the lower layer structure 34-1 of the isolation layer 34 are made of a same material, which may be silicon nitride. The first oxide layer is made of an oxide, which may be silicon dioxide. The material is not limited by the embodiment of the disclosure.

S44, portions, above every horizontal upper end face, of the first insulation layer and the first oxide layer, are removed, so as to expose the target contact surface.

The implementation flows of the corresponding methods for manufacturing a contact hole when the target contact hole to be manufactured is the target bit line contact hole, the target word line contact hole, the target active area contact hole and the target gate contact hole will be introduced below.

The semiconductor structure further includes second insulation layers 36 arranged on a top and sides of the bit line 31, a second oxide layer 37 is arranged on the substrate of the semiconductor structure, the second oxide layer 37 covers the second insulation layer 36 and the bit line 36, and an upper end face of the second oxide layer 37 is higher than an upper end face of the second insulation layer 36.

Figure 8:
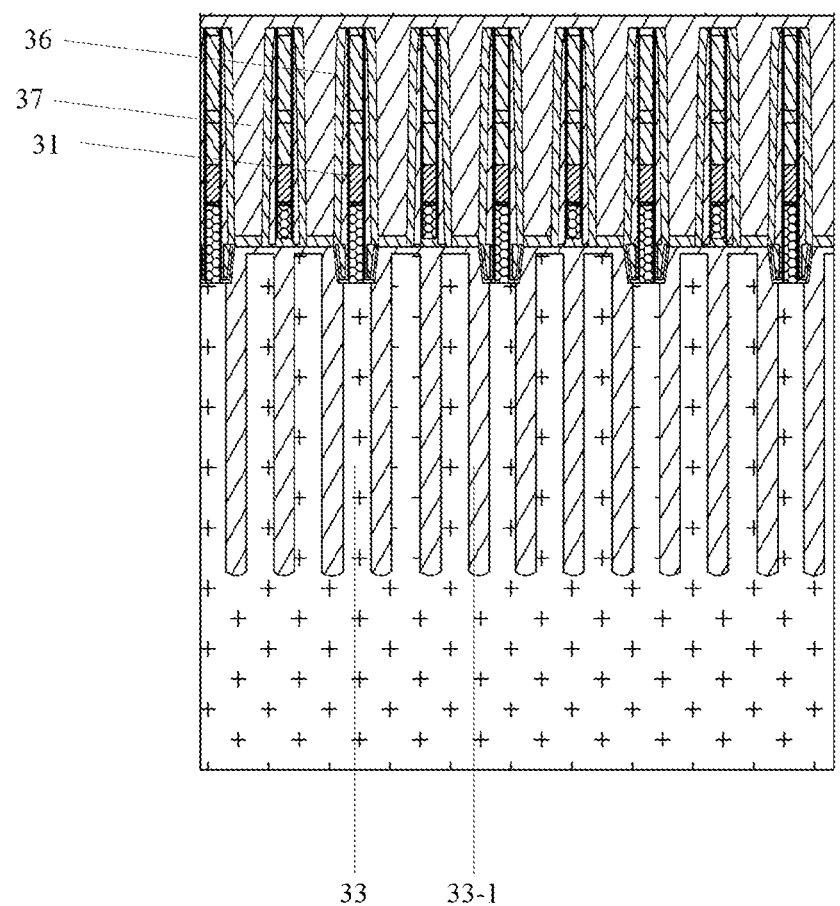
FIG. 8 is a sectional view of an initial structure of a semiconductor structure with a target bit line contact hole to be manufactured provided in the embodiment of the disclosure.
Figure 9:
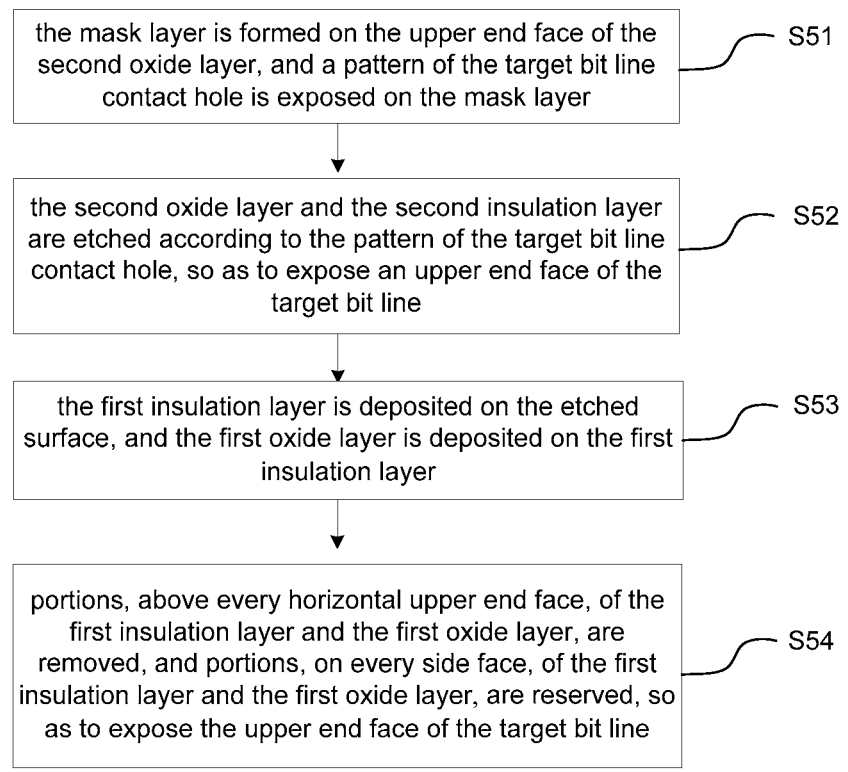
FIG. 9 is a schematic diagram of an implementation flow for manufacturing the target bit line contact hole provided in the embodiment of the disclosure.

When the target contact hole to be manufactured is the target bit line contact hole, an initial sectional view of a corresponding semiconductor structure with a target bit line contact hole to be manufactured is shown in FIG. 8, and the target bit line contact hole is manufactured according to a flow shown in FIG. 9, which may include:

S51, the mask layer is formed on the upper end face of the second oxide layer, and a pattern of the target bit line contact hole is exposed on the mask layer.

Figure 10:
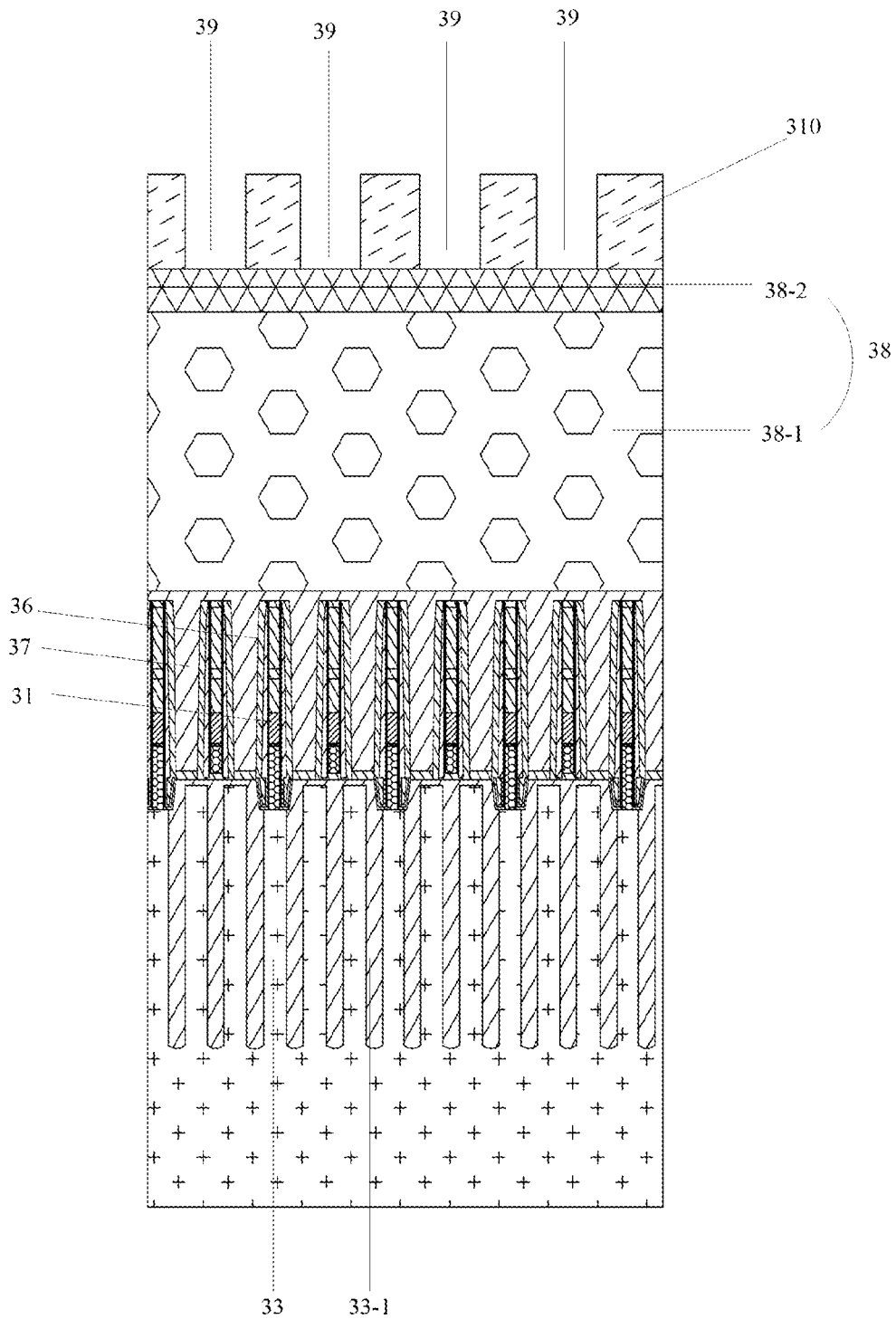
FIGS. 10-13 are sectional views of the semiconductor structure corresponding to each step for manufacturing the target bit line contact hole provided in the embodiment of the disclosure.

In specific implementation, as shown in FIG. 10, the mask layer 38 is formed on the upper end face of the second oxide layer 37, and the pattern of the target bit line contact hole 39 is exposed on the mask layer 38, where the mask layer 38 may include a first mask layer 38-1 and a second mask layer 38-2.

In specific implementation, the first mask layer 38-1 is deposited on the upper end face of the second oxide layer 37, the second mask layer 38-2 is deposited on the upper end face of the first mask layer 38-1, and the pattern of the target bit line contact hole 39 is exposed on the second mask layer 38-2 by means of photoresist 310. When the pattern of the target bit line contact hole 39 is exposed, a dimension (that is, a diameter) of the pattern of the target bit line contact hole 39 may be set to be slightly larger than an existing process dimension, such that a dimension (that is, a diameter of the target bit line contact hole) of an opening of the corresponding target bit line contact hole is larger than an existing process dimension. The dimension may be autonomously set according to actual situations, which may reduce difficulty of a process. The first mask layer 38-1 is made of carbon, and the second mask layer 38-2 is made of silicon oxynitride.

S52, the second oxide layer and the second insulation layer are etched according to the pattern of the target bit line contact hole, so as to expose an upper end face of the target bit line.

Figure 11:
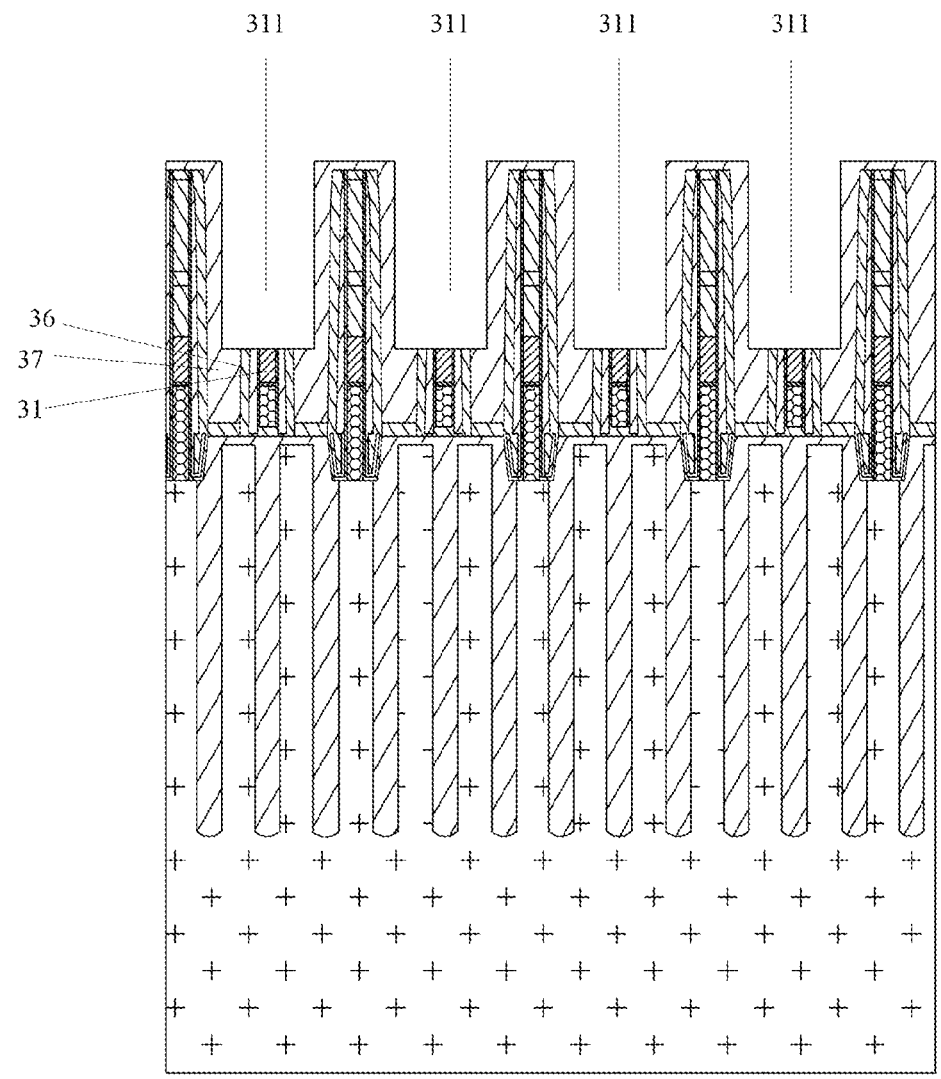

In specific implementation, as shown in FIG. 11, the second oxide layer 37 is etched according to the pattern of the target bit line contact hole 39 to form the target bit line contact hole 311, so as to expose the upper end face of the target bit line.

S53, the first insulation layer is deposited on the etched surface, and the first oxide layer is deposited on the first insulation layer.

Figure 12:
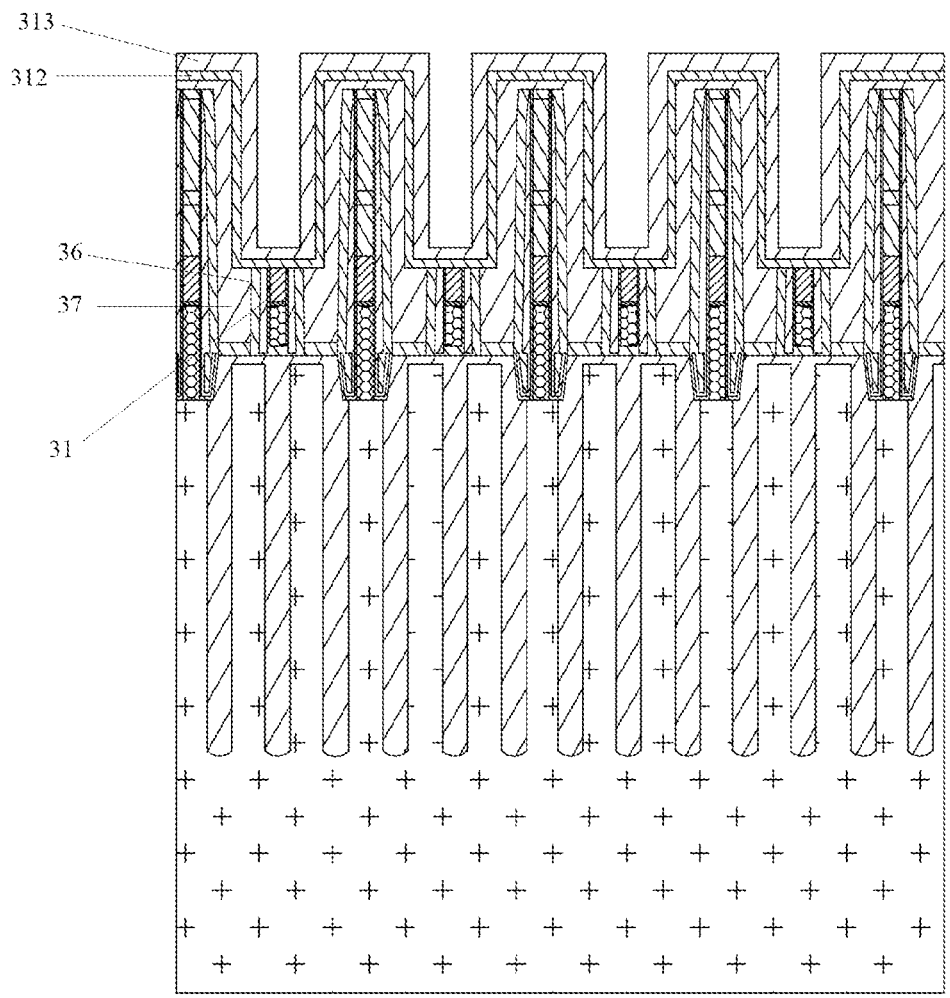

In specific implementation, as shown in FIG. 12, the first insulation layer 312 is deposited on the etched surface, and the first oxide layer 313 is deposited on a surface of the first insulation layer, so as to shrink the target bit line contact hole 311, and reduce direct parasitic capacitance of the target bit line contact hole. In specific implementation, the first insulation layer 312, and the upper layer structure 34-3 and the lower layer structure 34-1 of the isolation layer 34 are made of a same material, which may be silicon nitride. The first oxide layer 313 and the second oxide layer 37 are made of a same material, which may be silicon dioxide. The material is not limited by the embodiment of the disclosure.

S54, portions, above every horizontal upper end face, of the first insulation layer and the first oxide layer, are removed, and portions, on every side face, of the first insulation layer and the first oxide layer, are reserved, so as to expose the upper end face of the target bit line.

Figure 13:
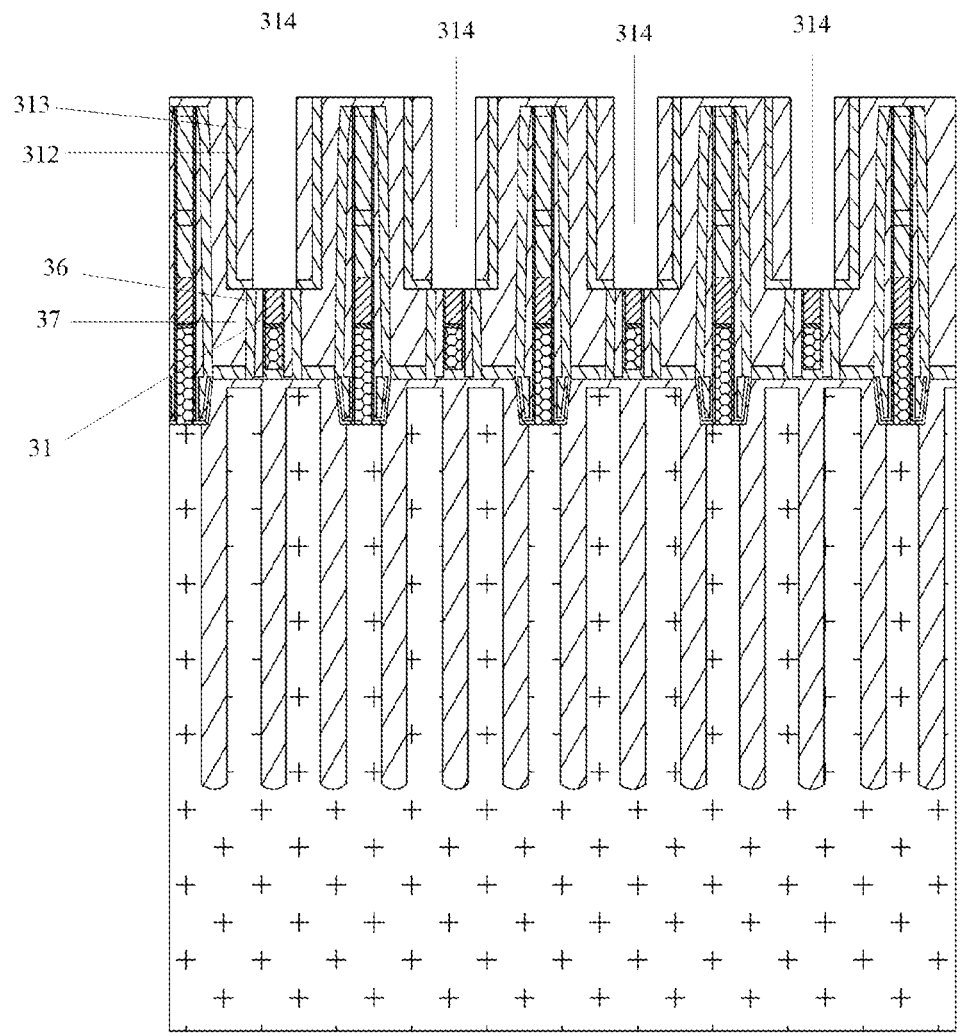

In specific implementation, as shown in FIG. 13, the portions, above every horizontal upper end face, of the first insulation layer 312 and first oxide layer 313 are removed, and the portions, on every side face, of the first insulation layer 312 and the first oxide layer 313 are reserved, so as to expose the upper end face of each of the target bit lines. Therefore, the target bit line contact hole 314 is formed and is in communication with the target bit line.

In the semiconductor structure, the word line 32 is embedded in the isolation structure 33-1, and a third insulation layer 315 is provided in a direction away from the isolation structure 33-1.

Figure 14:
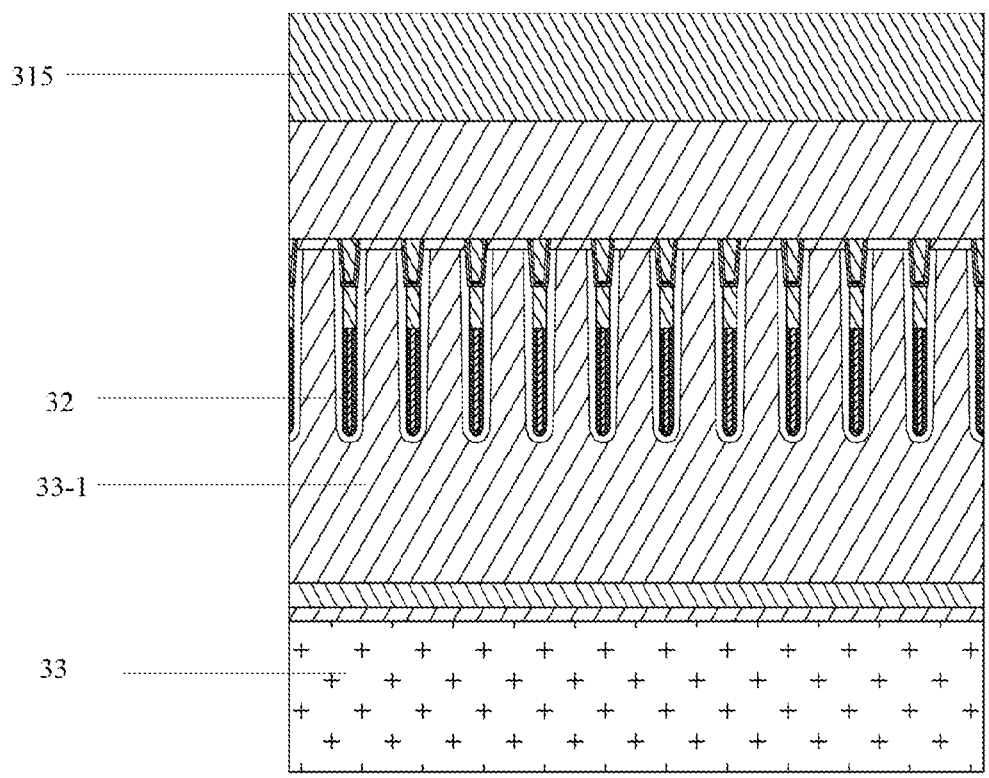
FIG. 14 is an initial sectional view of a semiconductor structure with a target word line contact hole to be manufactured provided in the embodiment of the disclosure.
Figure 15:
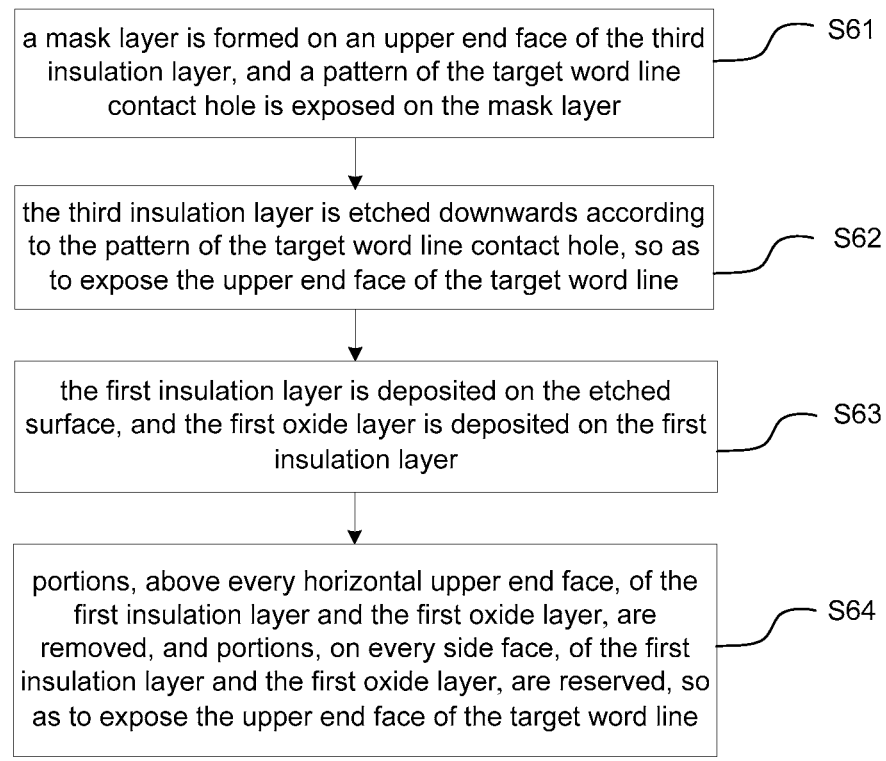
FIG. 15 is a schematic diagram of an implementation flow for manufacturing the target word line contact hole provided in the embodiment of the disclosure.

When the target contact hole to be manufactured is the target word line contact hole, an initial sectional view of a corresponding semiconductor structure with a target word line contact hole to be manufactured is shown in FIG. 14, and the target word line contact hole is manufactured according to a flow shown in FIG. 15, which may include:

S61, a mask layer is formed on an upper end face of the third insulation layer, and a pattern of the target word line contact hole is exposed on the mask layer.

Figure 16:
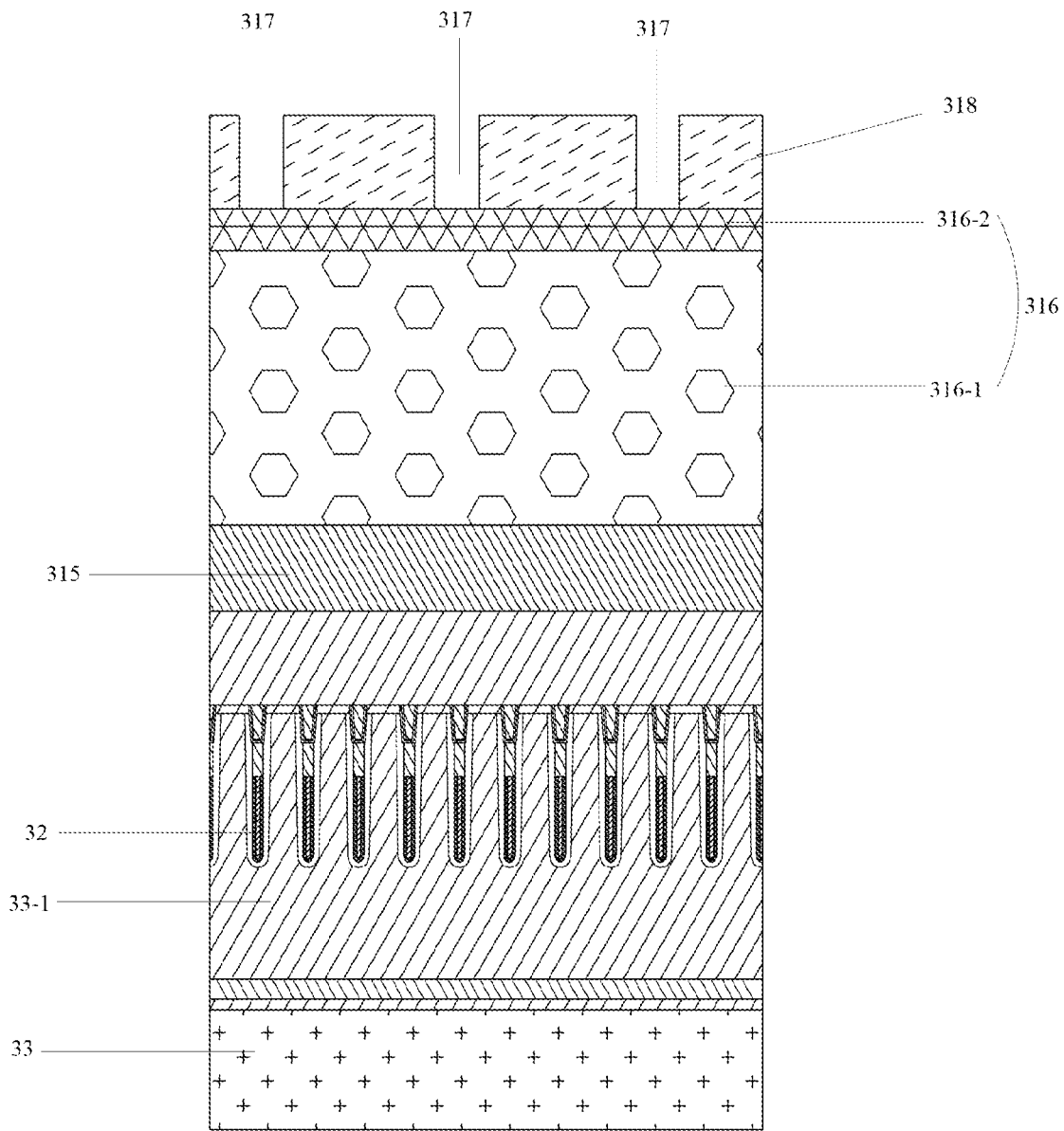
FIGS. 16-19 are sectional views of the semiconductor structure corresponding to each step for manufacturing the target word line contact hole provided in the embodiment of the disclosure.

In specific implementation, as shown in FIG. 16, the mask layer 316 is formed on the upper end face of the third insulation layer 315, and the pattern of the target word line contact hole 317 is exposed on the mask layer 316, where the mask layer 316 includes a first mask layer 316-1 and a second mask layer 316-2.

In specific implementation, the first mask layer 316-1 is deposited on the upper end face of the third insulation layer 315, the second mask layer 316-2 is deposited on the upper end face of the first mask layer 316-1, and the pattern of the target word line contact hole 317 is exposed on the second mask layer 316-2 by means of photoresist 318. When the pattern of the target word line contact hole 317 is exposed, a dimension (that is, a diameter) of the pattern of the target word line contact hole 317 may be set to be slightly larger than an existing process dimension, such that a dimension (that is, a diameter of the target word line contact hole) of an opening of the corresponding target word line contact hole is larger than an existing process dimension. The dimension may be set according to actual situations, which may reduce difficulty of a process. The first mask layer 316-1 is made of carbon, and the second mask layer 316-2 is made of silicon oxynitride.

S62, the third insulation layer is etched downwards according to the pattern of the target word line contact hole, so as to expose the upper end face of the target word line.

Figure 17:
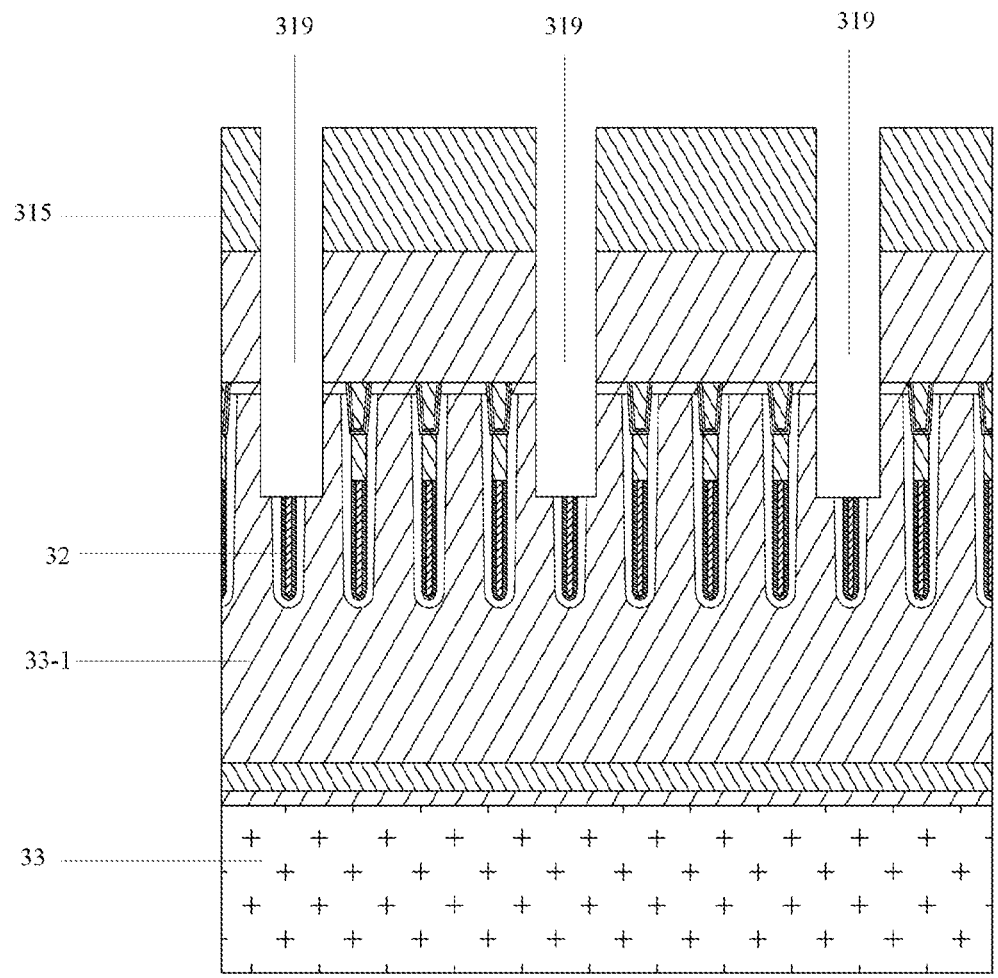

In specific implementation, as shown in FIG. 17, the third insulation layer 315 is etched downwards according to the pattern of the target word line contact hole 317 to form the target word line contact hole 319, so as to expose the upper end face of the target word line.

S63, the first insulation layer is deposited on the etched surface, and the first oxide layer is deposited on the first insulation layer.

Figure 18:
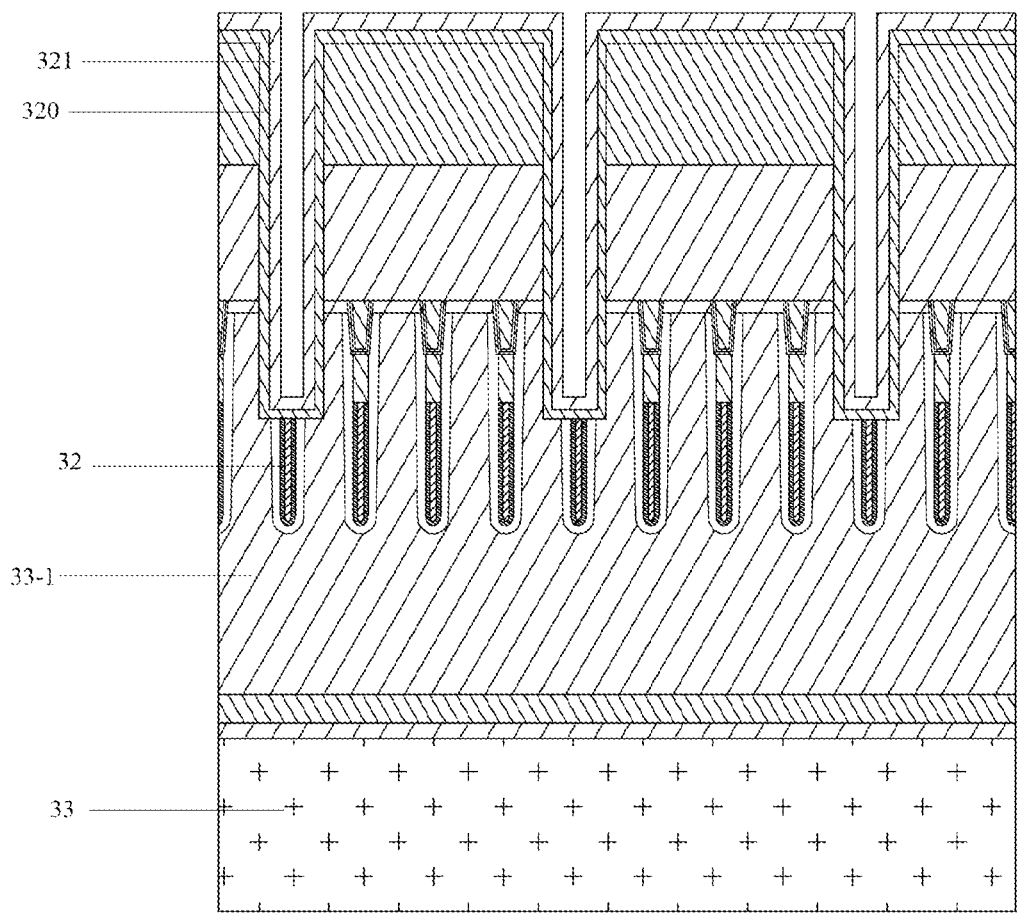

In specific implementation, as shown in FIG. 18, the first insulation layer 320 is deposited on the etched surface, and the first oxide layer 321 is deposited on a surface of the first insulation layer, so as to shrink the target word line contact hole 319, and reduce direct parasitic capacitance of the target word line contact hole. In specific implementation, the first insulation layer 320, and the upper layer structure 34-3 and the lower layer structure 34-1 of the isolation layer 34 are made of a same material, which may be silicon nitride. The first oxide layer 321 and the second oxide layer 37 are made of a same material, which may be silicon dioxide. The material is not limited by the embodiment of the disclosure. The third insulation layer 315, the first insulation layer 320, and the upper layer structure 34-3 and the lower layer structure 34-1 of the isolation layer 34 are made of a same material, which may be silicon nitride.

S64, portions, above every horizontal upper end face, of the first insulation layer and the first oxide layer, are removed, and portions, on every side face, of the first insulation layer and the first oxide layer, are reserved, so as to expose the upper end face of the target word line.

Figure 19:
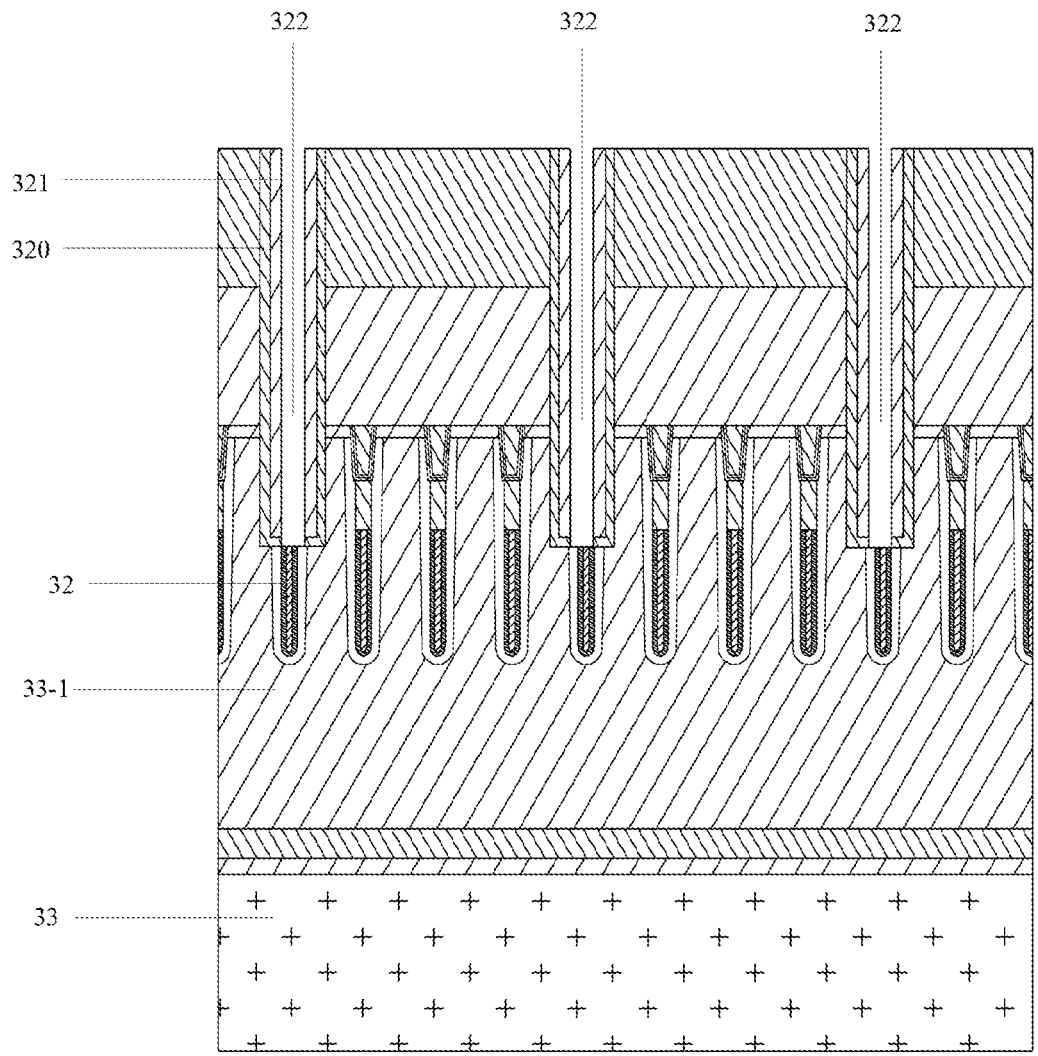

In specific implementation, as shown in FIG. 19, the portions, above every horizontal upper end face, of the first insulation layer 320 and the first oxide layer 321 are removed, and the portions, on every side face, of the first insulation layer 320 and the first oxide layer 321 are reserved, so as to expose the upper end face of the target word line. Therefore, the target word line contact hole 322 is formed and is in communication with the target word line.

Figure 20:
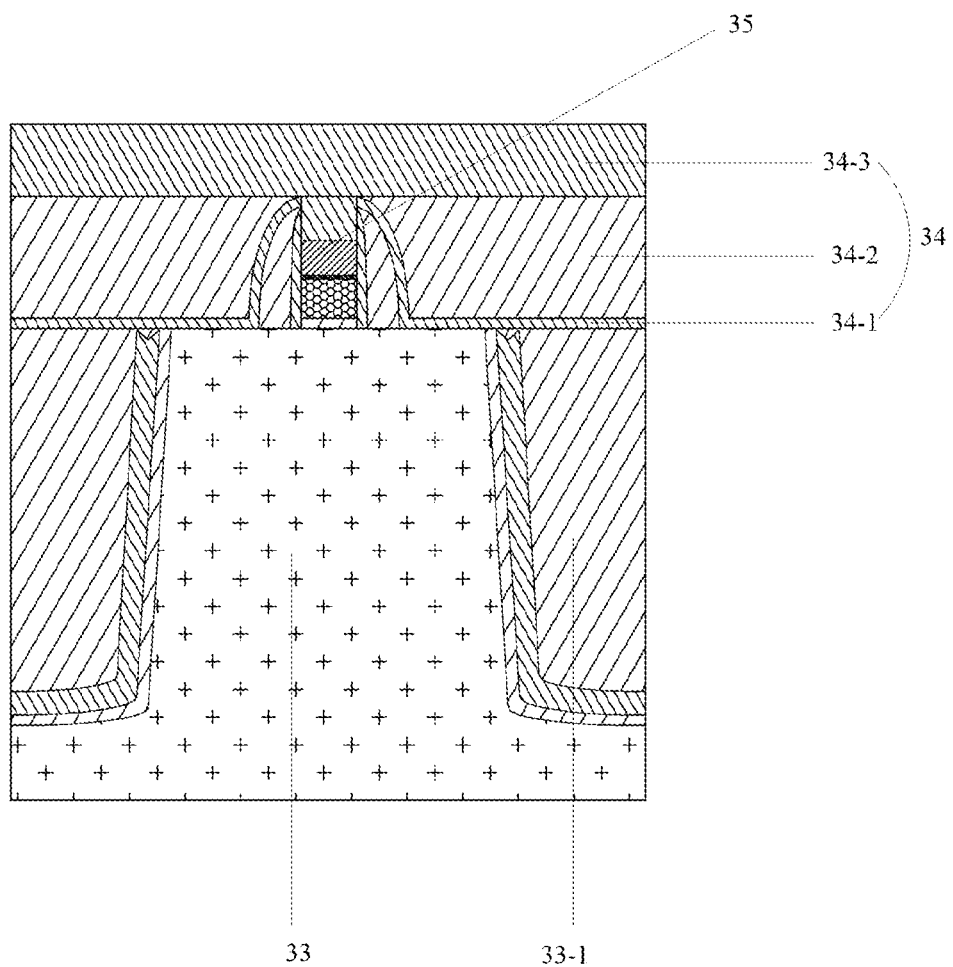
FIG. 20 is an initial sectional view of a semiconductor structure with a target active area contact hole to be manufactured provided in the embodiment of the disclosure.
Figure 21:
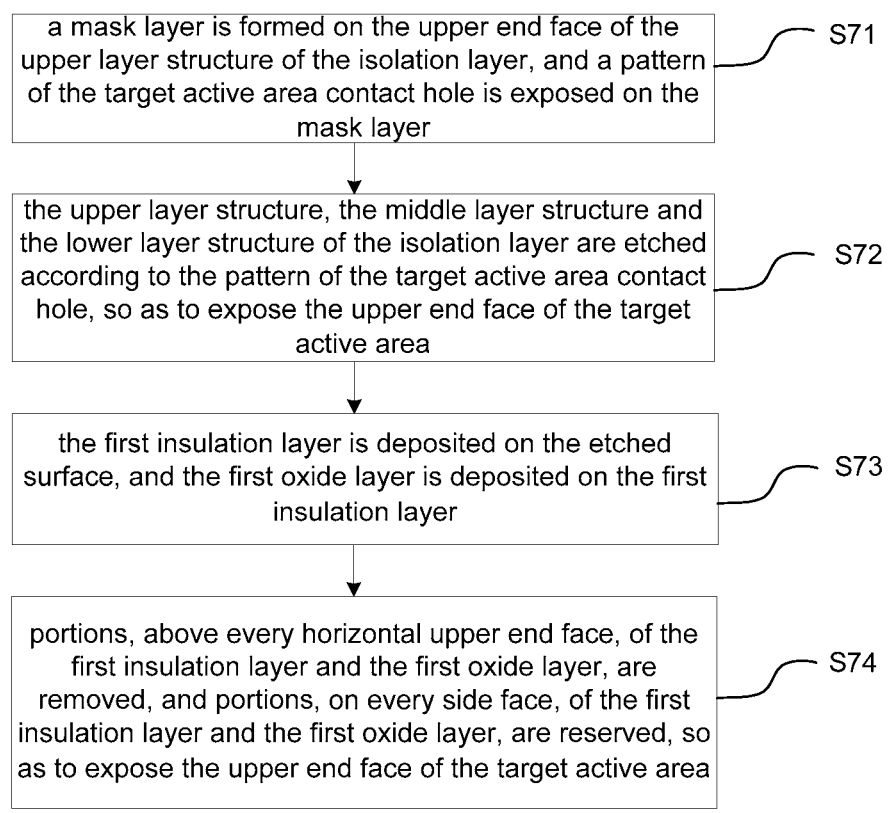
FIG. 21 is a schematic diagram of an implementation flow for manufacturing the target active area contact hole provided in the embodiment of the disclosure.

When the target contact hole to be manufactured is the target active area contact hole, an initial sectional view of a corresponding semiconductor structure with a target active area contact hole to be manufactured is shown in FIG. 20, and the target active area contact hole is manufactured according to the flow shown in FIG. 21, which may include:

S71, a mask layer is formed on the upper end face of the upper layer structure of the isolation layer, and a pattern of the target active area contact hole is exposed on the mask layer.

Figure 22:
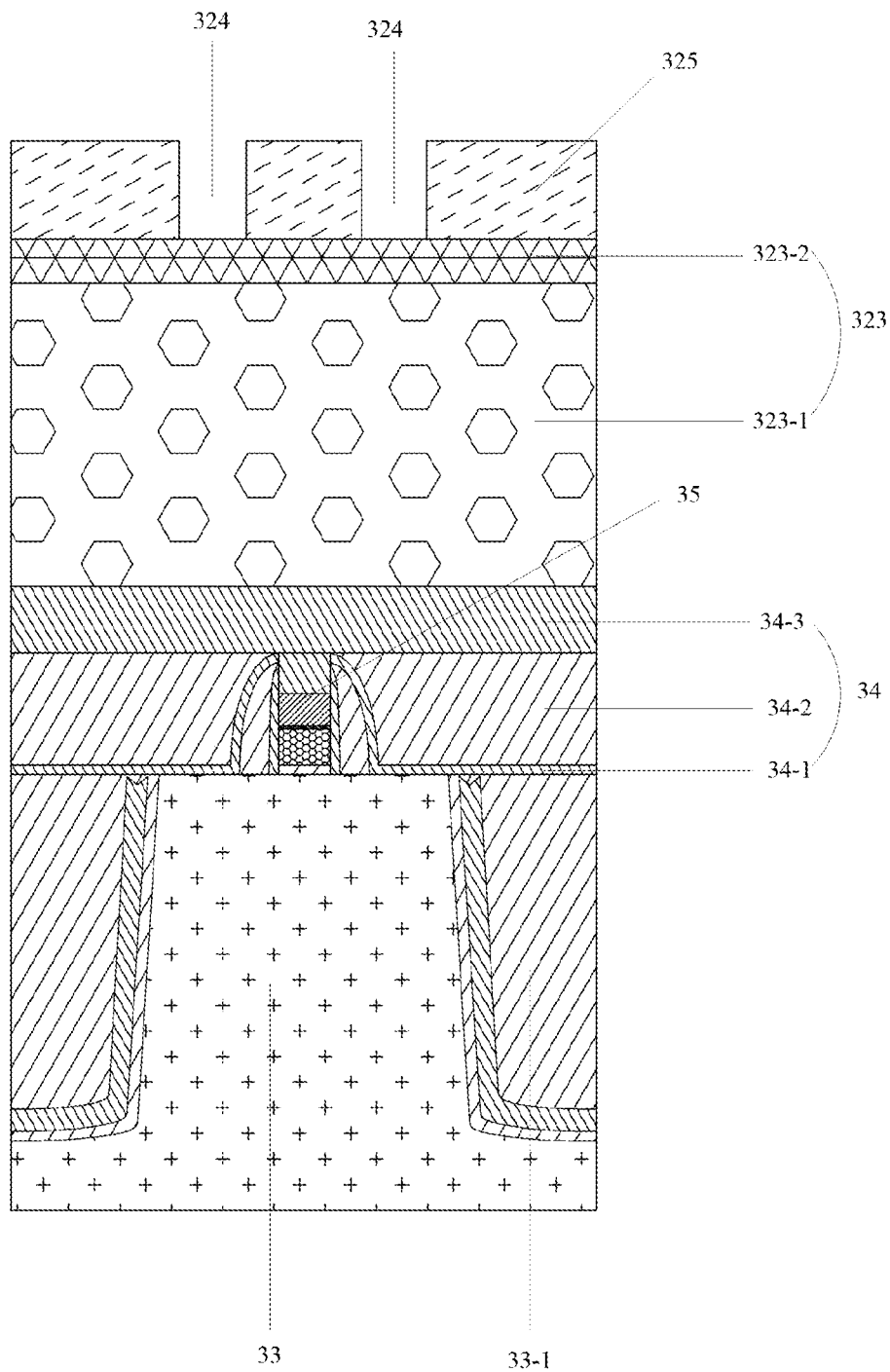
FIGS. 22-25 are sectional views of the semiconductor structure corresponding to each step for manufacturing the target active area contact hole provided in the embodiment of the disclosure.

In specific implementation, as shown in FIG. 22, the mask layer 323 is formed on the upper end face of the upper layer structure 34-3 of the isolation layer 34, and the pattern of the target active area contact hole 324 is exposed on the mask layer 323, where the mask layer 323 includes a first mask layer 323-1 and a second mask layer 323-2.

In specific implementation, the first mask layer 323-1 is deposited on the upper end face of the upper layer structure 34-3 of the isolation layer 34, the second mask layer 323-2 is deposited on an upper end face of the first mask layer 323-1, and the pattern of the target active area contact hole 324 is exposed on the second mask layer 323-2 by means of photoresist 325. When the pattern of the target active area contact hole 324 is exposed, a dimension (that is, a diameter) of the pattern of the target active area contact hole 324 may be set to be slightly larger than an existing process dimension, such that a dimension (that is, a diameter of the target active area contact hole) of an opening of the corresponding target active area contact hole is larger than an existing process dimension. The dimension may be set according to actual situations, which may reduce difficulty of a process. The first mask layer 323-1 is made of carbon, and the second mask layer 323-2 is made of silicon oxynitride.

S72, the upper layer structure, the middle layer structure and the lower layer structure of the isolation layer are etched according to the pattern of the target active area contact hole, so as to expose the upper end face of the target active area.

Figure 23:
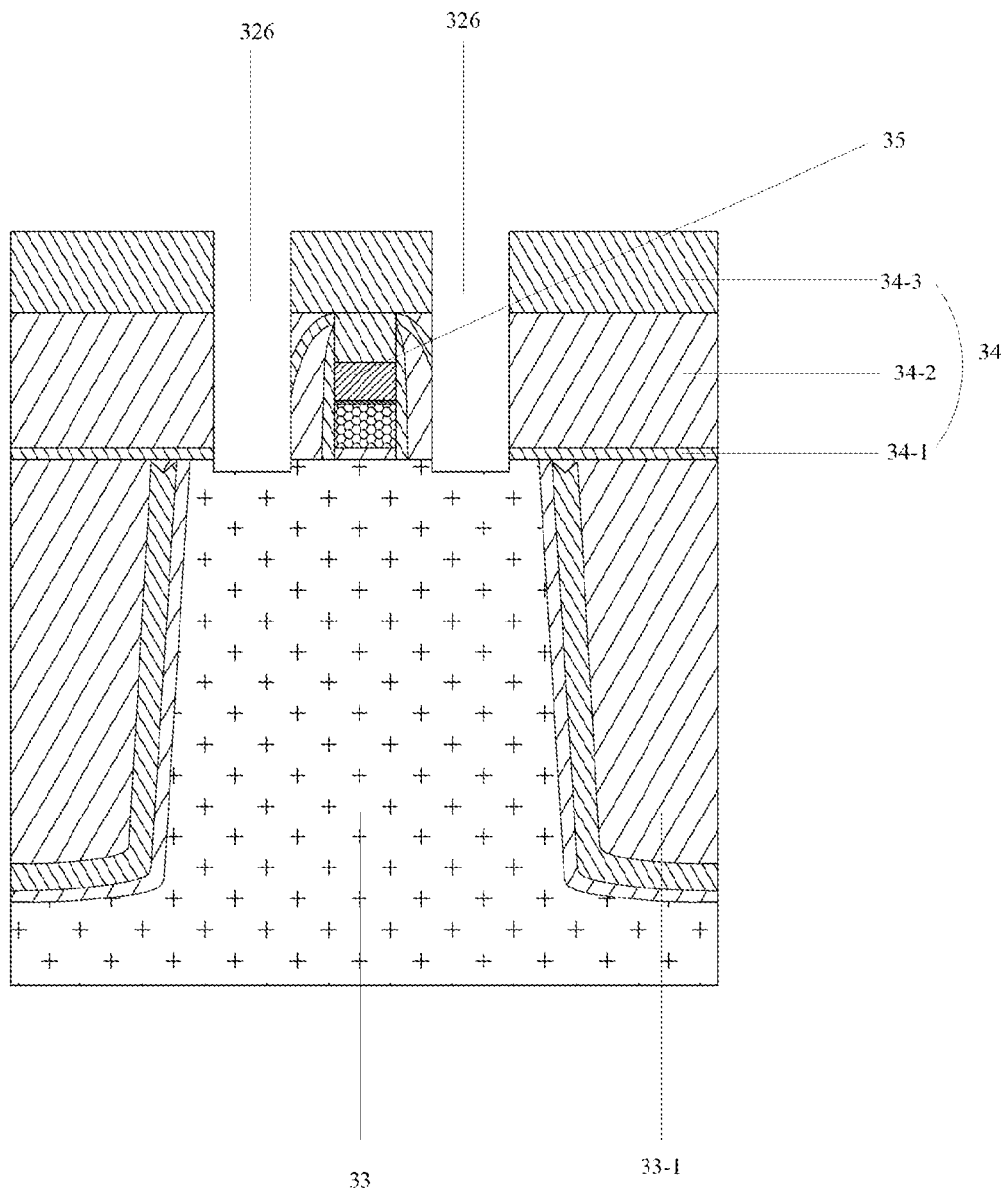

In specific implementation, as shown in FIG. 23, the upper layer structure 34-3, the middle layer structure 34-2 and the lower layer structure 34-1 of the isolation layer 34 are etched according to the pattern of the target active area contact hole 324 to form the target active area contact hole 326, so as to expose the upper end face of the target active area.

S73, the first insulation layer is deposited on the etched surface, and the first oxide layer is deposited on the first insulation layer.

Figure 24:
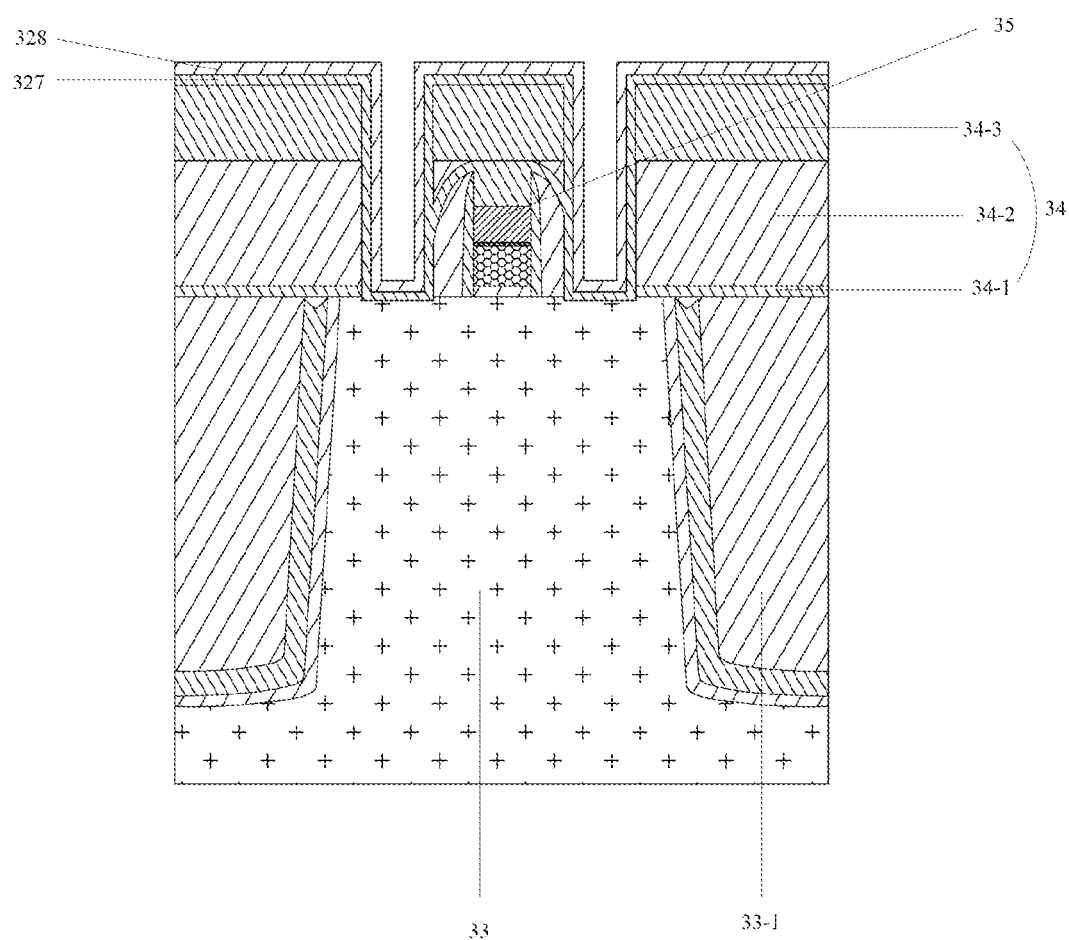

In specific implementation, as shown in FIG. 24, the first insulation layer 327 is deposited on the etched surface, and the first oxide layer 328 is deposited on the surface of the first insulation layer, so as to shrink the target active area contact hole 326, and reduce direct parasitic capacitance of the target active area contact hole. In specific implementation, the first insulation layer 327, and the upper layer structure 34-3 and the lower layer structure 34-1 of the isolation layer 34 are made of a same material, which may be silicon nitride. The first oxide layer 328 and the second oxide layer 37 are made of a same material, which may be silicon dioxide. The material is not limited by the embodiment of the disclosure.

S74, portions, above every horizontal upper end face, of the first insulation layer and the first oxide layer, are removed, and portions, on every side face, of the first insulation layer and the first oxide layer, are reserved, so as to expose the upper end face of the target active area.

Figure 25:
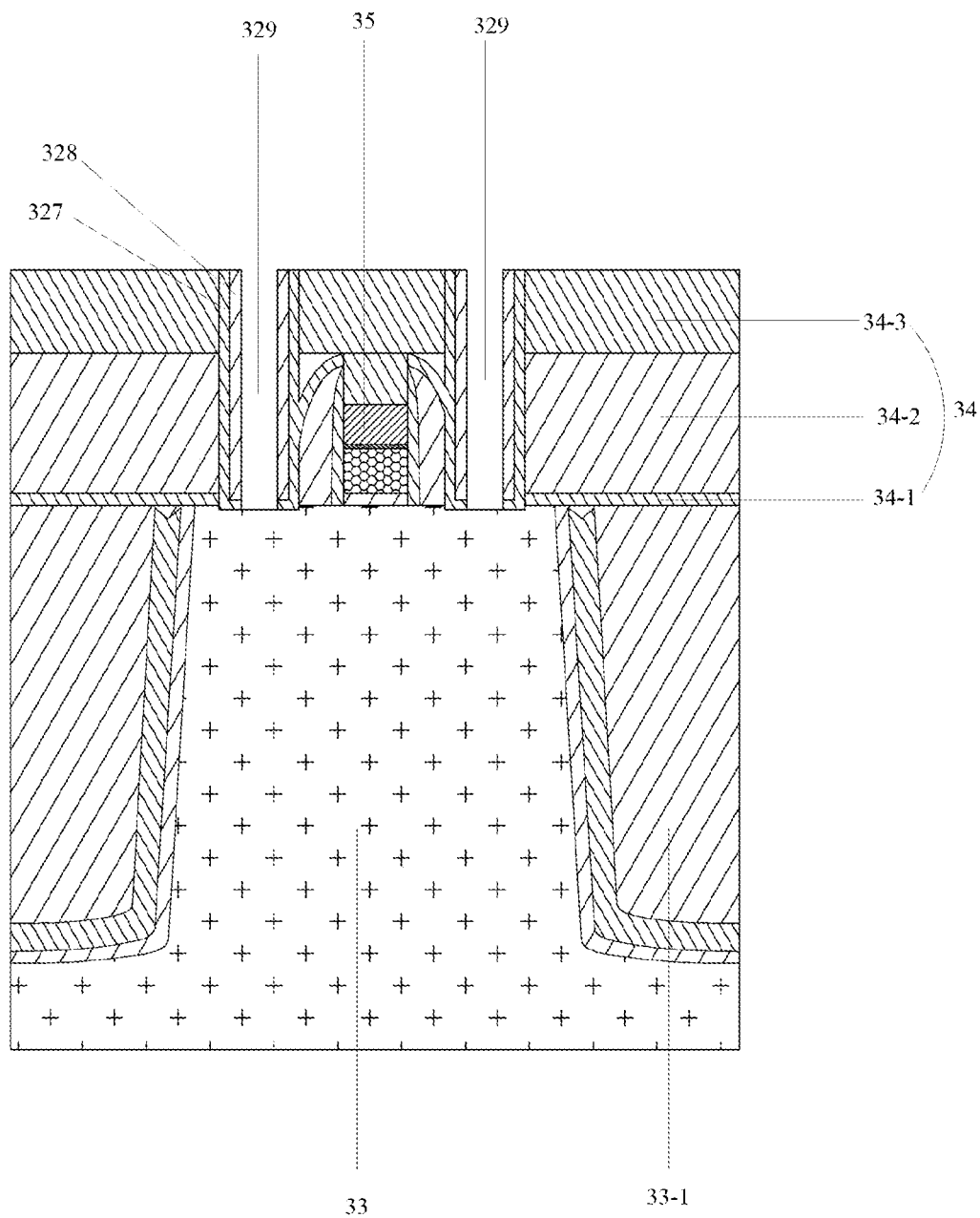

In specific implementation, as shown in FIG. 25, the portions, above every horizontal upper end face, of the first insulation layer 327 and the first oxide layer 328 are removed, and the portions, on every side face, of the first insulation layer 327 and the first oxide layer 328 are reserved, so as to expose the target active area upper end face. Therefore, the target active area contact hole 329 is formed and is in communication with the target active area.

A top face and side walls of the gate structure 35 of the semiconductor structure further includes insulation cover layers 330.

Figure 26:
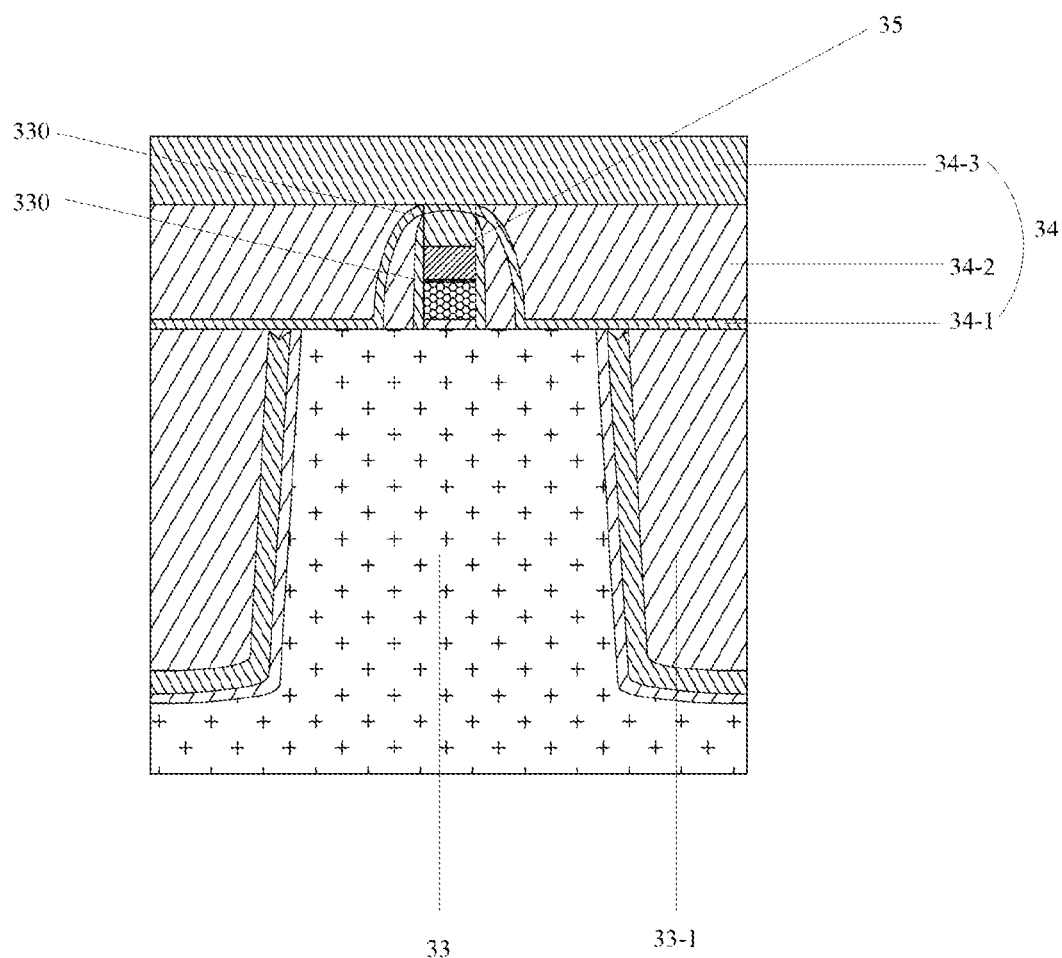
FIG. 26 is an initial sectional view of a semiconductor structure with a target gate contact hole to be manufactured provided in the embodiment of the disclosure.
Figure 27:
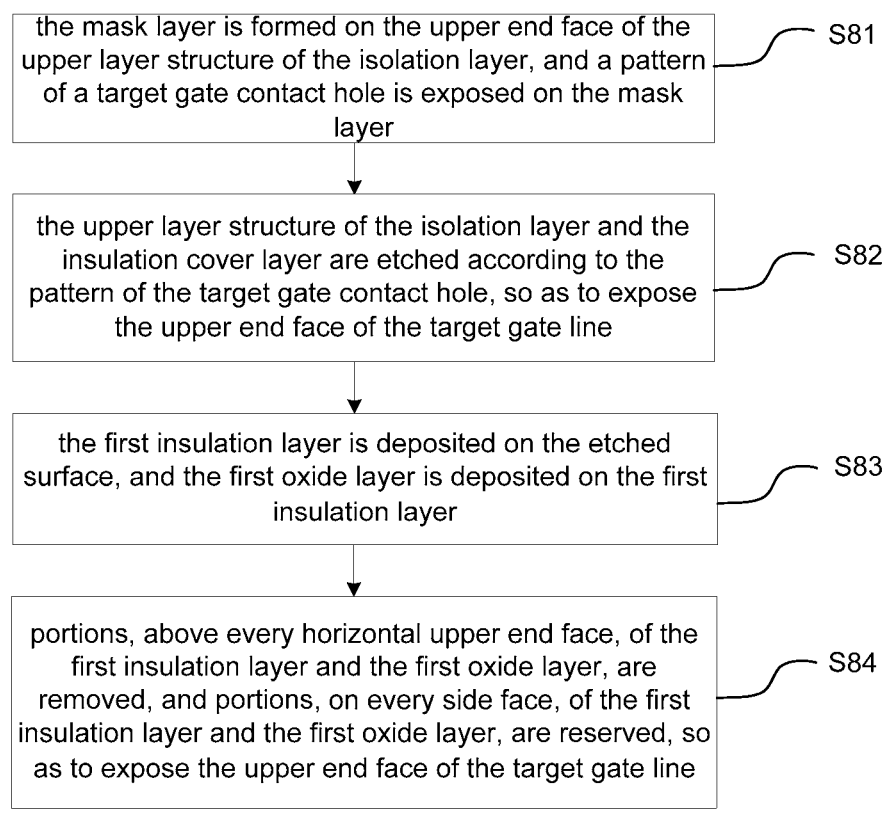
FIG. 27 is a schematic diagram of an implementation flow for manufacturing the target gate contact hole provided in the embodiment of the disclosure.

When the target contact hole to be manufactured is the target gate contact hole, an initial sectional view of a corresponding semiconductor structure with a target gate contact hole to be manufactured is shown in FIG. 26, and the target gate contact hole is manufactured according to the flow shown in FIG. 27, which may include:

S81, the mask layer is formed on the upper end face of the upper layer structure of the isolation layer, and a pattern of a target gate contact hole is exposed on the mask layer.

Figure 28:
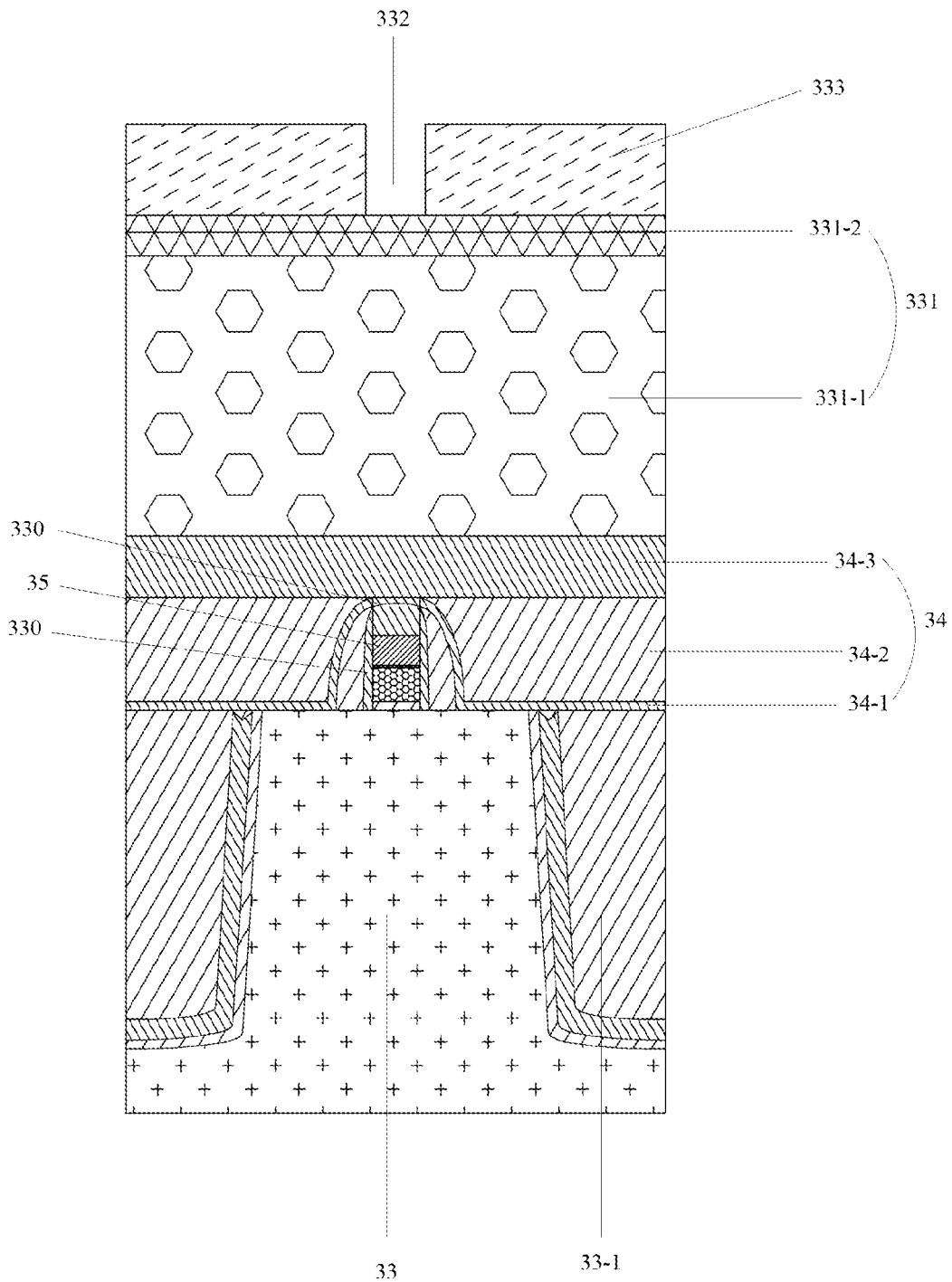
FIGS. 28-31 are sectional views of the semiconductor structure corresponding to each step for manufacturing the target gate contact hole provided in the embodiment of the disclosure.

In specific implementation, as shown in FIG. 28, the mask layer 331 is formed on the upper end face of the upper layer structure 34-3 of the isolation layer 34, and the pattern of the target gate contact hole 332 is exposed on the mask layer 331, where the mask layer 331 includes a first mask layer 331-1 and a second mask layer 331-2.

Specifically, the first mask layer 331-1 is deposited on the upper end face of the upper layer structure 34-3 of the isolation layer 34, the second mask layer 331-2 is deposited on an upper end face of the first mask layer 331-1, and the pattern of the target gate contact hole 332 is exposed on the second mask layer 331-2 by means of photoresist 333. When the pattern of the target gate contact hole 332 is exposed, a dimension (that is, a diameter) of the pattern of the target gate contact hole 332 may be set to be slightly larger than an existing process dimension, such that a dimension (that is, a diameter of the target gate contact hole) of an opening of the corresponding target gate contact hole is larger than an existing process dimension. The dimension may be set according to actual situations, which may reduce difficulty of a process. The first mask layer 331-1 is made of carbon, and the second mask layer 331-2 is made of silicon oxynitride.

S82, the upper layer structure of the isolation layer and the insulation cover layer are etched according to the pattern of the target gate contact hole, so as to expose the upper end face of the target gate line.

Figure 29:
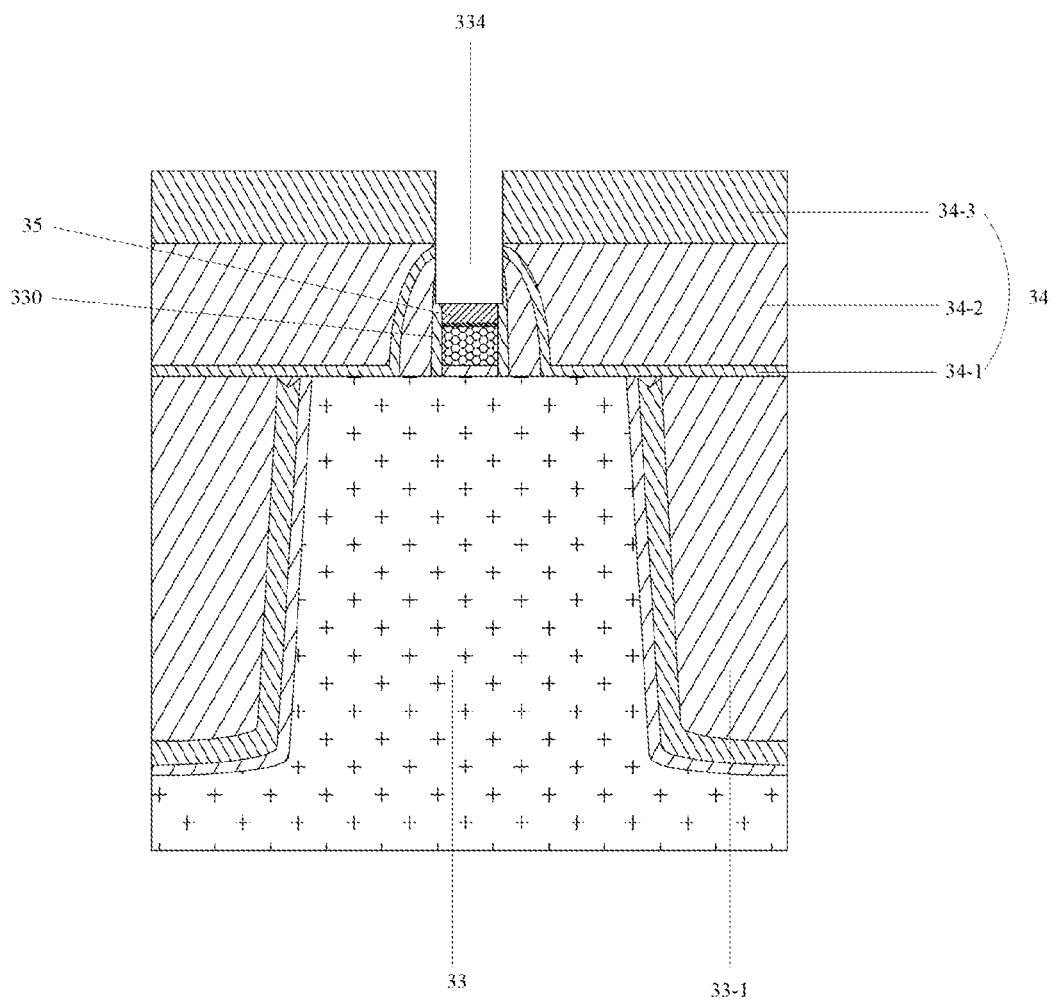

In specific implementation, as shown in FIG. 29, the upper layer structure 34-3 of the isolation layer 34 and the insulation cover layer 330 are etched according to the pattern of the target gate contact hole 332 to form a target gate contact hole 334, so as to expose the upper end face of the target gate line.

S83, the first insulation layer is deposited on the etched surface, and the first oxide layer is deposited on the first insulation layer.

Figure 30:
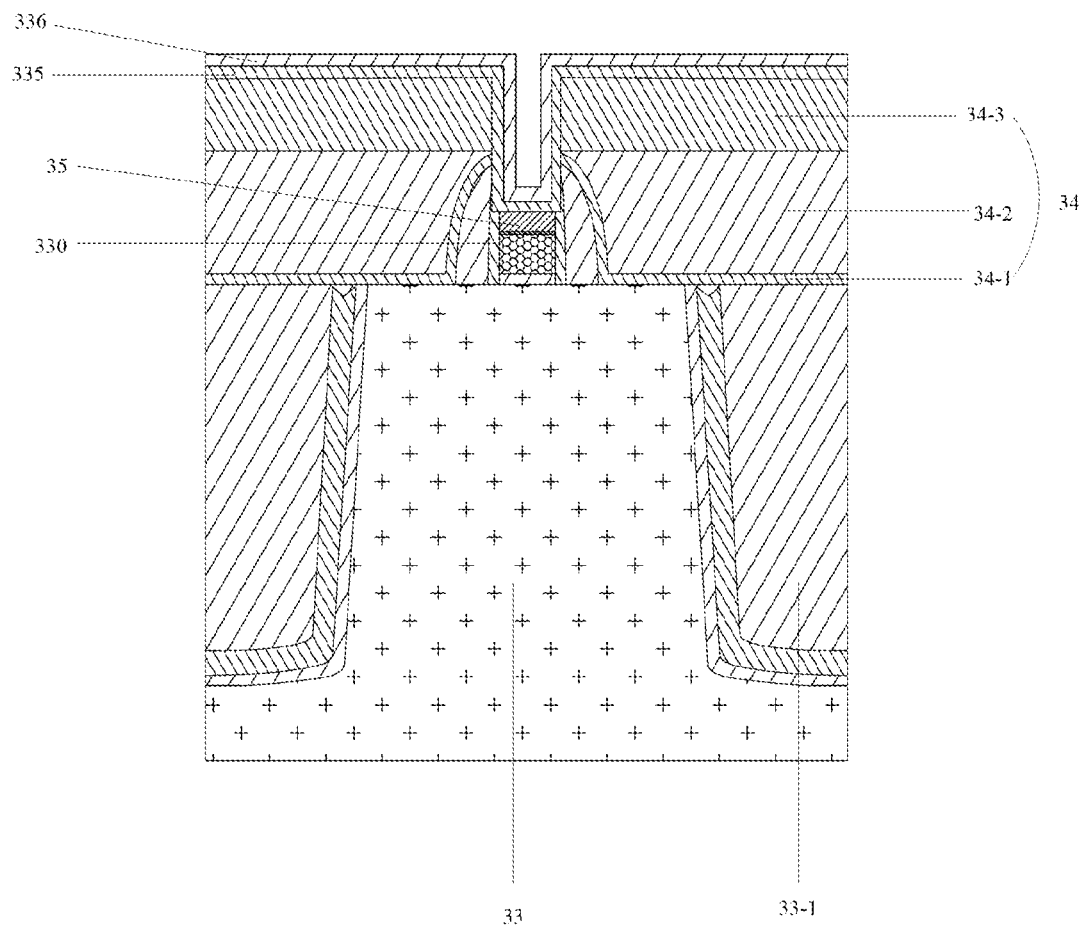

In specific implementation, as shown in FIG. 30, the first insulation layer 335 is deposited on the etched surface, and the first oxide layer 336 is deposited on the surface of the first insulation layer, so as to shrink the target gate contact hole 334, and reduce direct parasitic capacitance of the target gate contact hole. The first insulation layer 335, the insulation cover layer 330, and the upper layer structure 34-3 and the lower layer structure 34-1 of the isolation layer 34 are made of a same material, which may be silicon nitride. The first oxide layer 336 and the second oxide layer 37 are made of a same material, which may be silicon dioxide. The material is not limited by the embodiment of the disclosure.

S84, portions, above every horizontal upper end face, of the first insulation layer and the first oxide layer, are removed, and portions, on every side face, of the first insulation layer and the first oxide layer, are reserved, so as to expose the upper end face of the target gate line.

Figure 31:
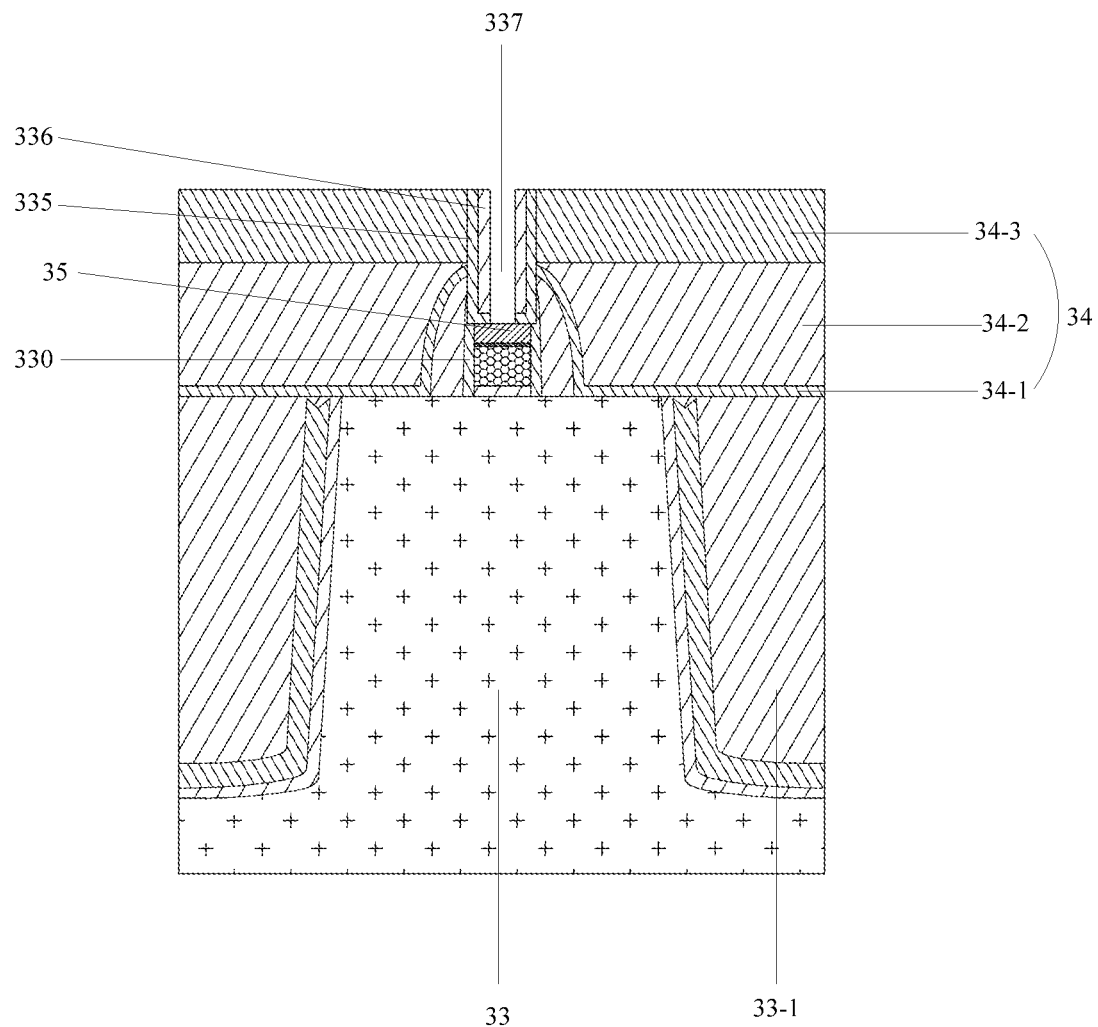

In specific implementation, as shown in FIG. 31, the portions, above every horizontal upper end face, of the first insulation layer 335 and the first oxide layer 336 are removed, and the portions, on every side face, of the first insulation layer 335 and the first oxide layer 336 are reserved, so as to expose the upper end face of the target gate line. Therefore, the target gate 337 is formed, and the target gate contact hole 337 is in communication with the target gate.

According to the method for manufacturing the target bit line contact hole, the method for manufacturing the target word line contact hole, the method for manufacturing the target active area contact hole and the method for manufacturing the target gate contact hole provided by the embodiment of the disclosure, the dimension of the target contact hole is enlarged at first, and then the dimension of the target contact hole is reduced by depositing the insulation layer and the oxide layer, such that a risk of insufficient etching caused by an over-small contact hole is avoided, a problem of a short circuit caused by an overlarge contact hole is avoided, difficulty of manufacturing a semiconductor is reduced, and damages to silicon in the active areas in the process is effectively reduced.

On the basis of the same inventive concept, the embodiment of the disclosure provides a semiconductor structure manufactured according to the method for manufacturing a contact hole provided by the embodiment of the disclosure.

On the basis of the same inventive concept, the embodiment of the disclosure provides electronic equipment including the semiconductor structure provided by the embodiment of the disclosure.

Apparently, those skilled in the art can make various modifications and variations to the disclosure without departing from the spirit and scope of the disclosure. In this way, if these modifications and variations of the disclosure fall within the scope of the claims of the disclosure and their equivalent technologies, the disclosure is also intended to include these modifications and variations.

What claimed is:

1. A method for manufacturing a contact hole, which is applied to a semiconductor structure comprising an array area and a peripheral area, wherein a substrate of the array area comprises an embedded word line and a first insulation layer, the first insulation layer is provided, in a direction away from the embedded word line, with a storage capacitor array and a contact layer, and the contact layer covers the storage capacitor array; a substrate of the peripheral area is provided with at least one active area, and an isolation layer and a gate structure are provided in a direction away from the at least one active area, and the isolation layer covers the gate structure; the isolation layer comprises a lower layer structure, a middle layer structure and an upper layer structure; two sides of the gate structure comprise zeroth layer contacts, and a top of each of the zeroth layer contacts is lower than an upper end face of the upper layer structure; and a first oxide layer is arranged in a direction away from the contact layer and the upper layer structure; and the method for manufacturing the contact hole comprises:

forming a mask layer on an upper end face of the first oxide layer, and exposing a pattern of a target contact hole on the mask layer;

etching the first oxide layer according to the pattern of the target contact hole, so as to expose a portion, corresponding to the target contact hole, of an upper end face of the contact layer and a portion, corresponding to the target contact hole, of the upper end face of the upper layer structure;

depositing a second insulation layer on an etched surface, and depositing a second oxide layer on the second insulation layer; and removing portions, above the upper end face of the first oxide layer, of the second insulation layer and the second oxide layer, etching downwards the upper end face of the contact layer which is exposed so as to remove a part of the contact layer, and etching downwards an upper end face of the upper layer structure which is exposed so as to expose an upper end face of the zeroth layer contact.

2. The method according to claim 1, wherein the mask layer comprises a first mask layer and a second mask layer; and forming the mask layer on the upper end face of the first oxide layer comprises:

forming the first mask layer on the upper end face of the first oxide layer, and forming the second mask layer on an upper end face of the first mask layer.

3. The method according to claim 2, wherein the first mask layer is made of carbon, and the second mask layer is made of silicon oxynitride.

4. The method according to claim 1, wherein the first insulation layer, the upper layer structure, the lower layer structure and the second insulation layer are made of a same material.

5. The method according to claim 1, wherein the second oxide layer and the first oxide layer are made of a same material.

6. The method according to claim 1, wherein the second oxide layer is made of silicon dioxide.

7. The method according to claim 1, wherein the second insulation layer is made of silicon nitride.

8. The method according to claim 1, wherein using dry etching to remove portions, above the upper end face of the first insulation layer, of the second insulation layer and the second oxide layer.

9. A method for manufacturing a contact hole, which is applied to a semiconductor structure, wherein a bit line, a word line, active areas and an isolation structure located between the active areas which are adjacent are manufactured on a substrate of the semiconductor structure, an isolation layer and a gate structure are provided in a direction away from the active areas, the isolation layer covers the gate structure, and the isolation layer comprises a lower layer structure, a middle layer structure and an upper layer structure; and the method comprises:

forming, with regard to the contact hole to be manufactured, a mask layer on a corresponding target upper end face, and exposing a pattern of a target contact hole on the mask layer, wherein the target contact hole is any one of a target bit line contact hole, a target word line contact hole, a target active area contact hole and a target gate contact hole, the target bit line contact hole representing a contact hole used for being connected to the bit line, the target word line contact hole representing a contact hole used for being connected to the word line, the target active area contact hole representing a contact hole used for being connected to the active areas, and the target gate contact hole representing a contact hole used for being connected to a gate of the gate structure;

etching according to the pattern of the target contact hole, so as to expose a target contact surface corresponding to the target contact hole, wherein the target contact surface is any one of an upper end face of a target bit line, an upper end face of a target word line, an upper end face of a target active area line and an upper end face of a target gate line;

depositing a first insulation layer on an etched surface, and depositing a first oxide layer on the first insulation layer; and removing portions, above every horizontal upper end face, of the first insulation layer and the first oxide layer, so as to expose the target contact surface.

10. The method according to claim 9, wherein the semiconductor structure further comprises second insulation layers arranged on a top and sides of the bit line, a second oxide layer is arranged on the substrate, the second oxide layer covers the second insulation layer and the bit line, and an upper end face of the second oxide layer is higher than an upper end face of the second insulation layer;

when the target contact hole is the target bit line contact hole, forming the mask layer on the corresponding target upper end face, and exposing the pattern of the target contact hole on the mask layer specifically comprise:

forming the mask layer on the upper end face of the second oxide layer, and exposing a pattern of the target bit line contact hole on the mask layer;

etching according to the pattern of the target contact hole, so as to expose the target contact surface corresponding to the target contact hole comprises:

etching the second oxide layer and the second insulation layer according to the pattern of the target bit line contact hole, so as to expose the upper end face of the target bit line; and removing the portions, above the every horizontal upper end face, of the first insulation layer and the first oxide layer, so as to expose the target contact surface comprises:

removing the portions, above the every horizontal upper end face, of the first insulation layer and the first oxide layer, and reserving portions, on every side face, of the first insulation layer and the first oxide layer, so as to expose the upper end face of the target bit line.

11. The method according to claim 9, wherein the word line is embedded in the isolation structure, and a third insulation layer is provided in a direction away from the isolation structure;

when the target contact hole is the target word line contact hole, forming the mask layer on the corresponding target upper end face, and exposing the pattern of the target contact hole on the mask layer comprise:

forming the mask layer on an upper end face of the third insulation layer, and exposing a pattern of the target word line contact hole on the mask layer;

etching according to the pattern of the target contact hole, so as to expose the target contact surface corresponding to the target contact hole specifically comprises:

etching downwards the third insulation layer according to the pattern of the target word line contact hole, so as to expose the upper end face of the target word line; and removing the portions, above the each horizontal upper end face, of the first insulation layer and the first oxide layer, so as to expose the target contact surface comprises:

removing the portions, above the every horizontal upper end face, of the first insulation layer and the first oxide layer, and reserving portions, on every side face, of the first insulation layer and the first oxide layer, so as to expose the upper end face of the target word line.

12. The method according to claim 9, wherein
when the target contact hole is the target active area contact hole, forming the mask layer on the corresponding target upper end face, and exposing the pattern of the target contact hole on the mask layer comprise:
forming the mask layer on the upper end face of the upper layer structure, and exposing a pattern of the target active area contact hole on the mask layer;
etching according to the pattern of the target contact hole, so as to expose the target contact surface corresponding to the target contact hole specifically comprises:
etching the upper layer structure, the middle layer structure and the lower layer structure according to the pattern of the target active area contact hole, so as to expose the target active area upper end face; and
removing the portions, above the every horizontal upper end face, of the first insulation layer and the first oxide layer, so as to expose the target contact surface specifically comprises:
removing the portions, above the every horizontal upper end face, of the first insulation layer and the first oxide layer, and reserving portions, on every side face, of the first insulation layer and the first oxide layer, so as to expose the target active area upper end face.

13. The method according to claim 9, wherein a top face and side walls of the gate structure further comprise insulation cover layers;
when the target contact hole is the target gate contact hole, forming the mask layer on the corresponding target upper end face, and exposing the pattern of the target contact hole on the mask layer comprise:
forming the mask layer on the upper end face of the upper layer structure, and exposing a pattern of the target gate contact hole on the mask layer;
etching according to the pattern of the target contact hole, so as to expose the target contact surface corresponding to the target contact hole specifically comprises:
etching the upper layer structure and the insulation cover layer according to the pattern of the target gate contact hole, so as to expose the upper end face of the target gate line; and
removing the portions, above the every horizontal upper end face, of the first insulation layer and the first oxide layer, so as to expose the target contact surface comprises:
removing the portions, above the every horizontal upper end face, of the first insulation layer and the first oxide layer, and reserving portions, on every side face, of the first insulation layer and the first oxide layer, so as to expose the upper end face of the target gate line.

14. The method according to claim 9, wherein the first oxide layer is made of silicon dioxide.

15. The method according to claim 9, wherein the first insulation layer is made of silicon nitride.

16. A semiconductor structure, which is manufactured according to the method for manufacturing a contact hole of claim 1.

17. Electronic equipment, which comprises the semiconductor structure of claim 16.

18. The semiconductor structure according to claim 16, wherein the first insulation layer, the upper layer structure, the lower layer structure and the second insulation layer are made of the same material.

19. The semiconductor structure according to claim 16, wherein the second oxide layer and the first oxide layer are made of the same material.

20. A semiconductor structure, which is manufactured according to the method for manufacturing a contact hole of 9.

* * * * *